(12) United States Patent
Lee

(10) Patent No.: US 9,620,246 B2
(45) Date of Patent: Apr. 11, 2017

(54) OPERATING METHOD OF MEMORY SYSTEM

(71) Applicant: SK hynix Inc., Gyeonggi-do (KR)

(72) Inventor: Hyung-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 14/712,656

(22) Filed: May 14, 2015

(65) Prior Publication Data

US 2016/0179615 A1 Jun. 23, 2016

(30) Foreign Application Priority Data

Dec. 18, 2014 (KR) .................. 10-2014-0183456

(51) Int. Cl.
*G11C 29/00* (2006.01)
*G11C 29/52* (2006.01)
*G11C 29/02* (2006.01)
*G06F 11/10* (2006.01)

(52) U.S. Cl.
CPC .......... *G11C 29/52* (2013.01); *G06F 11/1048* (2013.01); *G11C 29/021* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 7,975,192 B2 | 7/2011 | Sommer et al. | |
| 7,995,388 B1 * | 8/2011 | Winter | G11C 11/5642 365/185.03 |
| 8,861,272 B1 * | 10/2014 | Horn | G11C 29/42 365/185.03 |
| 2004/0136220 A1 * | 7/2004 | Cohen | G06F 11/1008 365/100 |
| 2007/0263455 A1 * | 11/2007 | Cornwell | G11C 11/5628 365/185.28 |
| 2008/0198650 A1 * | 8/2008 | Shalvi | G11C 16/26 365/185.02 |
| 2013/0343131 A1 * | 12/2013 | Wu | G11C 16/26 365/185.24 |
| 2014/0269058 A1 * | 9/2014 | Liu | G11C 11/5628 365/185.03 |
| 2015/0149818 A1 * | 5/2015 | Kalavade | G06F 11/073 714/6.13 |

FOREIGN PATENT DOCUMENTS

| | | |
|---|---|---|
| KR | 1020100027787 | 3/2010 |
| KR | 1020130034522 | 4/2013 |

* cited by examiner

*Primary Examiner* — Daniel McMahon
(74) *Attorney, Agent, or Firm* — IP & T Group LLP

(57) ABSTRACT

Second data is generated by re-reading first data using a second read voltage when a first ECC decoding to first data using a first read voltage fails. Third data is generated by performing a second ECC decoding to the second data. An error-bit-number, which is a number of bits different between the second data and the third data, is obtained when the second ECC decoding fails. The process is repeated by changing the second read voltage until the error-bit-number is smaller than a predetermined threshold value. A third ECC decoding is performed to an optimal data that is the second data read using the second read voltage, with which the error-bit-number is smaller than the predetermined threshold value.

16 Claims, 15 Drawing Sheets

OPERATING METHOD OF MEMORY SYSTEM

CROSS-REFERENCE TO RELATED APPLICATIONS

The present application claims priority of Korean Patent Application No. 10-2014-0183456, filed on Dec. 18, 2014, which is herein incorporated by reference in its entirety.

BACKGROUND

1. Field

Various exemplary embodiments of the present invention relate to a memory system, and more particularly, to a read method of the memory system capable of improving reliability of data read.

2. Description of the Related Art

Semiconductor memory devices are generally classified into volatile memory devices and nonvolatile memory devices. A volatile memory device loses data stored therein when a power supply thereto is interrupted, whereas a nonvolatile memory device retains data stored therein even when a power supply thereto is interrupted. Examples of the nonvolatile memory devices are a ROM (Read Only Memory), an EEPROM (Electrically Erasable ROM), and so forth. A flash memory device which is Introduced as a flash EEPROM is different in structure and operation from a conventional EEPROM. The flash memory device performs an electric erase operation by unit of block and a program operation by unit of bit.

When a memory device performs a program/erase cycle a predetermined number of times or performs the program operation on the memory block and the number of times the program/erase cycle is performed is over a predetermined number of times, the distribution of the threshold voltages of the memory block may change. The change of the threshold voltages of the flash memory device may deteriorate the reliability of a read data. Therefore, the number of error bits should be minimized by reading data through changing the optimal read voltage. That is, the read voltage is set using a method of providing a read-retry table to a controller and sequentially changing the read voltage included in the read-retry table during a read operation, a method of analysing the gradient of the threshold voltage in the threshold voltage distribution, and a method of analysing threshold voltage at which a number of memory cells is minimized between the read voltage sections.

However, the methods use threshold voltage distribution and thus there is a low possibility of setting the optimal read voltage.

SUMMARY

Various embodiments of the present invention are directed to an operating method of a memory system including a method of setting an optimal read voltage for reliably reading data.

In accordance with an embodiment of the present invention, a read method of a semiconductor memory system including a nonvolatile memory device and a memory controller may include: a first step of performing a first ECC decoding to first data stored in the nonvolatile memory device, wherein the first data is read using a first read voltage; a second step of generating second data by re-reading the first data using a second read voltage when the first ECC decoding fails; a third step of generating third data by performing a second ECC decoding to the second data; a fourth step of obtaining a number of error bits by counting bits different between the second data and the third data when the second ECC decoding fails; a fifth step of repeating the second through the fourth steps by changing the second read voltage until the number of error bits is smaller than a predetermined threshold value; a sixth step of setting the second read voltage as an optimal read voltage with which the number of error bits is smaller than a predetermined threshold value and further setting the second data read using the optimal read voltage as a optimal data; and a seventh step of performing a third ECC decoding to the optimal data.

The fourth step may perform an exclusive OR operation to the second data and the third data to obtain the number of error bits. The fifth step may repeat the second through the fourth steps by changing the second read voltage by a fixed amount of voltage variation. The second ECC decoding may be a hard decoding. The third ECC decoding may be a soft decoding.

In accordance with an embodiment of the present invention, a read method of a semiconductor memory system including a nonvolatile memory device and a memory controller may include: a first step of performing a first ECC decoding to first data stored in the nonvolatile memory device; a second step of generating second data by re-reading the first data using a second read voltage when the first ECC decoding fails; a third step of generating third data by performing a second ECC decoding to the second data; a fourth step of obtaining a number of error bits by counting bits different between the second data and the third data when the second ECC decoding fails; a fifth step of obtaining a plurality of number of error bits by repeating the second through the fourth steps and by changing the second read voltage; a sixth step of setting as an optimal read voltage the second read voltage with which the minimum number of error bits is obtained among the plurality of number of error bits and further setting the second data read using the optimal read voltage as an optimal data; and a seventh step of performing a third ECC decoding to the optimal data.

The fourth step may obtain the number of error bits through an exclusive OR operation to the second data and the third data. The fifth step may repeat the second through the fourth steps by changing the second read voltage by a fixed amount. The second ECC decoding may be a hard decoding. The third ECC decoding may be a soft decoding.

In accordance with an embodiment of the present invention, a read method of a semiconductor memory system including a nonvolatile memory device and a memory controller may include: a first step of performing a first ECC decoding to first data stored in the nonvolatile memory device, wherein the first data is read using a first read voltage; a second step of generating second data by re-reading the first data using a second read voltage when the first ECC decoding falls; a third step of generating third data by performing a second ECC decoding to the second data; a fourth step of obtaining a number of error bits by counting bits different between the second data and the third data when the second ECC decoding fails; a fifth step of repeating the second through the fourth steps a predetermined number of times by changing the second read voltage until the number of error bits is smaller than a predetermined threshold value; a sixth step of setting as an optimal read voltage the second read voltage with which the minimum number of error bits is obtained among the plurality of number of error bits and further setting the second data read using the optimal read voltage as a optimal data; and a seventh step of performing a third ECC decoding to the optimal data.

The third step may obtain the number of error bits through an exclusive OR operation to the first data and the second data. The fourth step may repeat the second and third steps by changing the read voltage by a fixed amount of voltage variation. The sixth step may perform the third ECC decoding according to the read voltage corresponding to a minimum number of error bits among the plurality of numbers of error bits obtained by the third step when the number of error bits is still greater than the predetermined threshold value despite of the predetermined number of times of the repetition of the second and third steps. The second ECC decoding may be a hard decoding. The third ECC decoding may be a soft decoding.

In accordance with an embodiment of the present invention, data may be reliably read by setting the optimal read voltage using a number of error bits between data which is re-read at a changed read voltage and a hard decoding data formed by a hard decoding.

DETAILED DESCRIPTION

Figure 1:
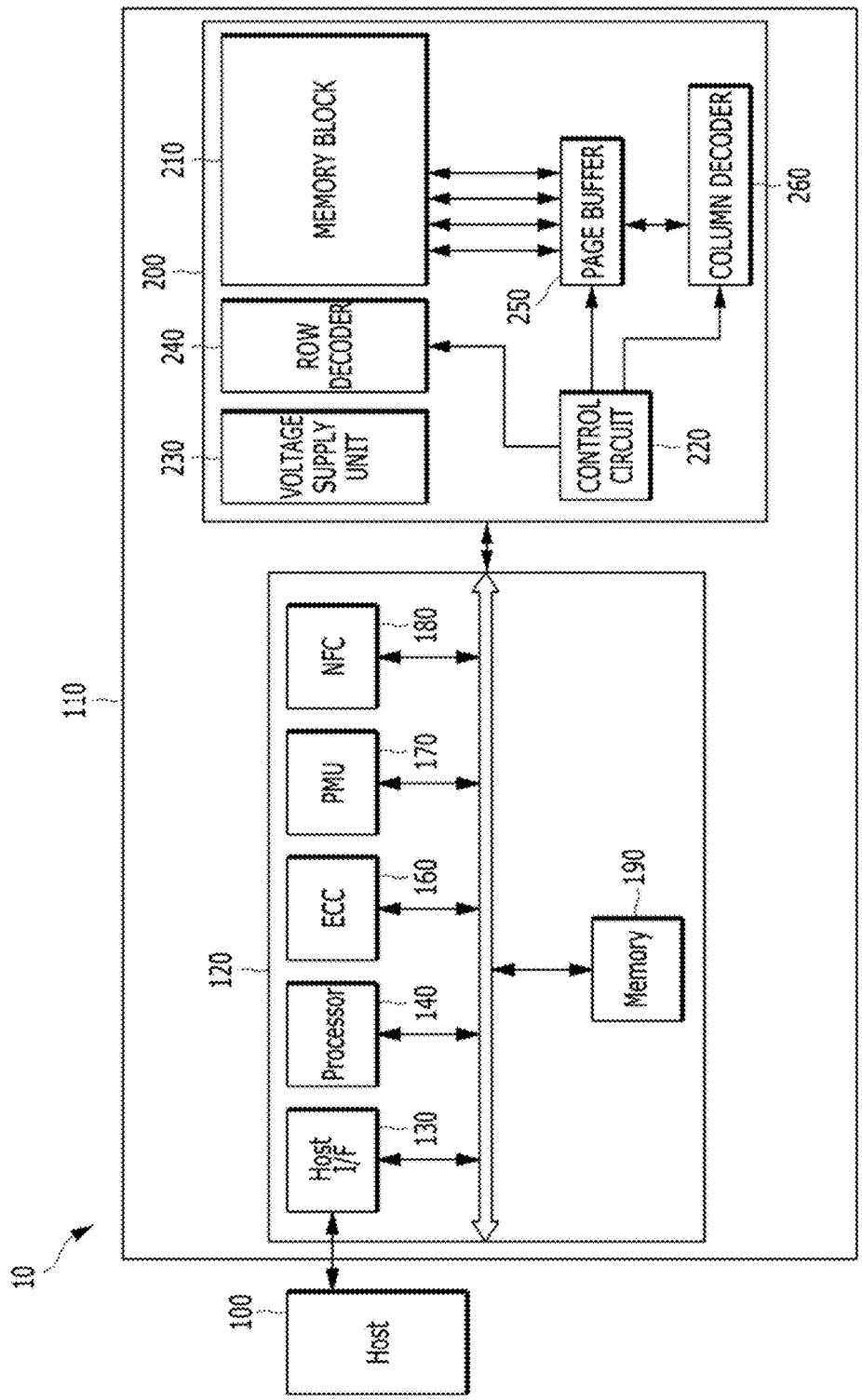
FIG. 1 is a block diagram illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated to clearly Illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case in which the first layer is formed directly on the second layer or the substrate but also a case in which a third layer exists between the first layer and the second layer or the substrate.

FIG. 1 is a block diagram illustrating a semiconductor memory system in accordance with an embodiment of the present invention. FIG. 1 shows a data processing system 10 including the semiconductor memory system in accordance with an embodiment of the present invention.

Referring to FIG. 1, the data processing system 10 may include a host 100 and the semiconductor memory system 110.

For example, the host 100 may include a portable electronic device such as a mobile phone, a MP3 player, a laptop computer, and so forth, and an electronic device such as a desktop computer, a game player, a TV, a projector, and so forth.

The semiconductor memory system 110 may be operable in response to a request of the host 100, and may store data to be accessed by the host 100. That is, the semiconductor memory system 110 may serve as a main storage device or a secondary storage device. The semiconductor memory device 110 may be implemented with one of various storage devices according to a host interface protocol coupled to the host 100. For example, the semiconductor memory device 110 may be implemented with one of the various storage devices such as solid state drive (SSD), a multimedia card (MMC), an embedded MMC (eMMC), a reduced-size MMC (RS-MMC), and a micro-size version of MMC (MMCmicro), a secure digital (SD) card, a mini secure digital (miniSD) card, a micro secure digital (microSD) card, an universal storage bus (USB) storage device, a universal flash storage (UFS) device, compact flash (CF) card, a smart media (SM) card, a memory stick, and so forth.

A semiconductor memory device 200 included in the semiconductor memory system 110 may be implemented with a volatile memory device such as a DRAM (Dynamic Random Access Memory) and a SRAM (Static RAM), and a nonvolatile memory device such as a ROM (Read Only Memory), a MROM (Mask ROM), PROM (Programmable ROM), an EPROM (Erasable ROM), an EEPROM (Electrically Erasable ROM), a FRAM (Ferromagnetic ROM), a PRAM (Phase change RAM), a MRAM (Magnetic RAM), a RRAM (Resistive RAM) and a flash memory.

The semiconductor memory system 110 may include a semiconductor memory device 200 for storing data to be accessed by the host 100, and a memory controller 120 for controlling data storage to the semiconductor memory device 200.

The controller 120 and the semiconductor memory device 200 may be integrated as a single semiconductor device. For example, the controller 120 and the semiconductor memory device 200 may be integrated as a single semiconductor device to form a solid-state drive (SSD). The solid state drive may include a storage device for storing data in a semiconductor memory. When the semiconductor memory system 110 is used as the SSD, operation speed of the host 100 coupled to the semiconductor memory system 110 may be remarkably improved.

The controller 120 and the semiconductor memory device 200 may be integrated as a single semiconductor device to configure a memory card. For example, the controller 120 and the semiconductor memory device 200 may be integrated as a single semiconductor device to form a memory card such as a PC card of personal computer memory card international association (PCMCIA), a compact flash (CF) card, a smart media (SM) card, a memory stick, a multimedia card (MMC), a reduced-size multimedia card (RS-MMC), and a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 110 may be provided as one of various elements forming an electronic device, such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

The semiconductor memory device 200 of the semiconductor memory system 110 may retain data stored therein even when power supply thereto is interrupted. The semiconductor memory device 200 may store data provided from the host 100 through the write operation, and may provide stored data to the host 100 through the read operation.

The semiconductor memory device 200 may include a memory block 210, a control circuit 220, a voltage supply unit 230, a row decoder 240, a page buffer 250, and a column decoder 260. The semiconductor memory device 200 may be the nonvolatile memory device, for example, the flash memory device. The semiconductor memory device 200 may be a 3-dimensional stack structure.

The memory block 210 may include a plurality of pages, each of which includes a plurality of memory cells coupled to a plurality of word lines.

The control circuit 220 may control various operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region, in which the memory cells are formed. A voltage generating operation of the voltage supply circuit 230 may be performed under control of the control logic 220. The voltage supply unit 230 may generate a plurality of variable read voltages for generation of a plurality of read data.

The row decoder 240 may select one of the memory blocks or sectors of the memory cell array 210 and may select one among the word lines of the selected memory block under the control of the control logic 220. The row decoder 240 may provide the word line voltage generated from the voltage supply circuit 230 to selected word lines or non-selected word lines under the control of the control logic 220.

During the program operation, the page buffer 250 may operate as a write driver for driving the bit lines according to data to be stored in the memory block 210. During the program operation, the page buffer 250 may receive the data to be written in the memory block 210 from a buffer (not Illustrated) and may drive the bit lines according to the input data. The page buffer 250 may be formed of a plurality of page buffers (PB) 251 corresponding to the columns (or the bit lines) or column pairs (or bit line pairs), respectively. A plurality of latches may be included in each of the plurality of page buffers 251.

The memory controller 120 of the semiconductor memory system 110 may control the semiconductor memory device 200 in response to a request from the host 100. For example, the memory controller 120 may provide data read from the semiconductor memory device 200 to the host 100, and may store data from the host 100 into the semiconductor memory device 200. Furthermore, the memory controller 120 may control the read, write, program and erase operations of the semiconductor memory device 200.

The memory controller 120 may include a host interface unit 130, a processor 140, an error correction code (ECC) unit 160, a power management unit (PMU) 170, a NAND flash controller (NFC) 180, and a memory 190.

The host interface 140 may process a command and data from the host 100 and may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 160 may detect and correct an error included in data read from the memory block 210 during the read operation. The ECC unit 160 may perform the ECC decoding on the data read from the memory block 210, determine whether or not the ECC decoding succeeds, output an instruction signal according to the determination result, and correct error bits of the read data using parity bits generated during the ECC encoding. When a number of error bits included in the read data is beyond the error-correction capability of the ECC unit 160, the ECC unit may not correct the error bits, and thus may output an error correction fall signal.

The ECC unit 160 may correct an error through a coded modulation such as low density parity check (LDPC) code, a Bose-Chaudhuri-Hocquenghem (BCH) code, a turbo code, an Reed-Solomon (RS) code, a convolution code, an RSC (Recursive Systematic Code), Trellis-Coded Modulation (TCM), Block Coded Modulation (BCM), and so on. The ECC unit 160 may include an error correction circuit, an error correction system, and an error correction device.

The PMU 170 may provide and manage power to the memory controller 120.

The NFC 180 may serve as an interface between the memory controller 120 and the semiconductor memory device 200 for the memory controller 120 to control the semiconductor memory device 200 in response to the host 100. When the semiconductor memory device 200 is the flash memory device, for example, the NAND flash memory device, the NFC 180 may generate a control signal of the semiconductor memory device 200 and process data under the control of the processor 140.

The memory 190 may be an operational memory for the semiconductor memory system 110 and the memory controller 120, and may store data for driving the semiconductor memory system 110 and the memory controller 120. When the memory controller 120 provides data read from the semiconductor memory device 200 to the host 100 and stores data from the host 100 into the semiconductor memory device 200 during the read, write, program and erase operations of the semiconductor memory device 200 in response to the request of the host 100, the memory 190 may store data for the operation of the semiconductor memory system 110 or the operation between the memory controller 120 and the semiconductor memory device 200.

The memory 190 may be implemented with the volatile memory device such as the DRAM and the SRAM. The memory 190 may store data for the write and read operations between the memory controller 120 and the semiconductor memory device 200, and data during the write and read operations. Additionally, the memory 190 may include a program memory, a data memory, a write buffer, a read buffer, a map buffer, and so forth.

Also, the memory 190 may store data for the operation occurring between the ECC unit 160 and the processor 140 such as data read from the semiconductor memory device 200 and data generated during the read operation. That is, the memory 190 may store data read from the semiconductor memory device 200. The data may include user data, parity data and status data. The status data may include information of a cycling group which is applied to the memory block 210 of the semiconductor memory device 200 during the program operation.

The processor 140 may perform general various control operations of the semiconductor memory system 110. The processor 140 may control the write operation or the read operation to the semiconductor memory device 200 in response to a write request or a read request of the host 100. The processor 140 may drive firmware, referred to as a flash translation layer (FTL), for general control of the semiconductor memory system 110. The processor 140 may be implemented with a microprocessor or a central processing unit (CPU).

When the processor 140 receives an error correction fail signal from the ECC unit 160, the processor 140 may check the cycling group. The cycling group information is included in the status data of the data from the memory 190. The processor 140 may control the read operation to the semiconductor memory device 200 and re-read the data using a read voltage selected based on the cycling group which is checked by the processor 140. The processor 140 may provide the re-read data to the ECC unit 160.

Figure 2:
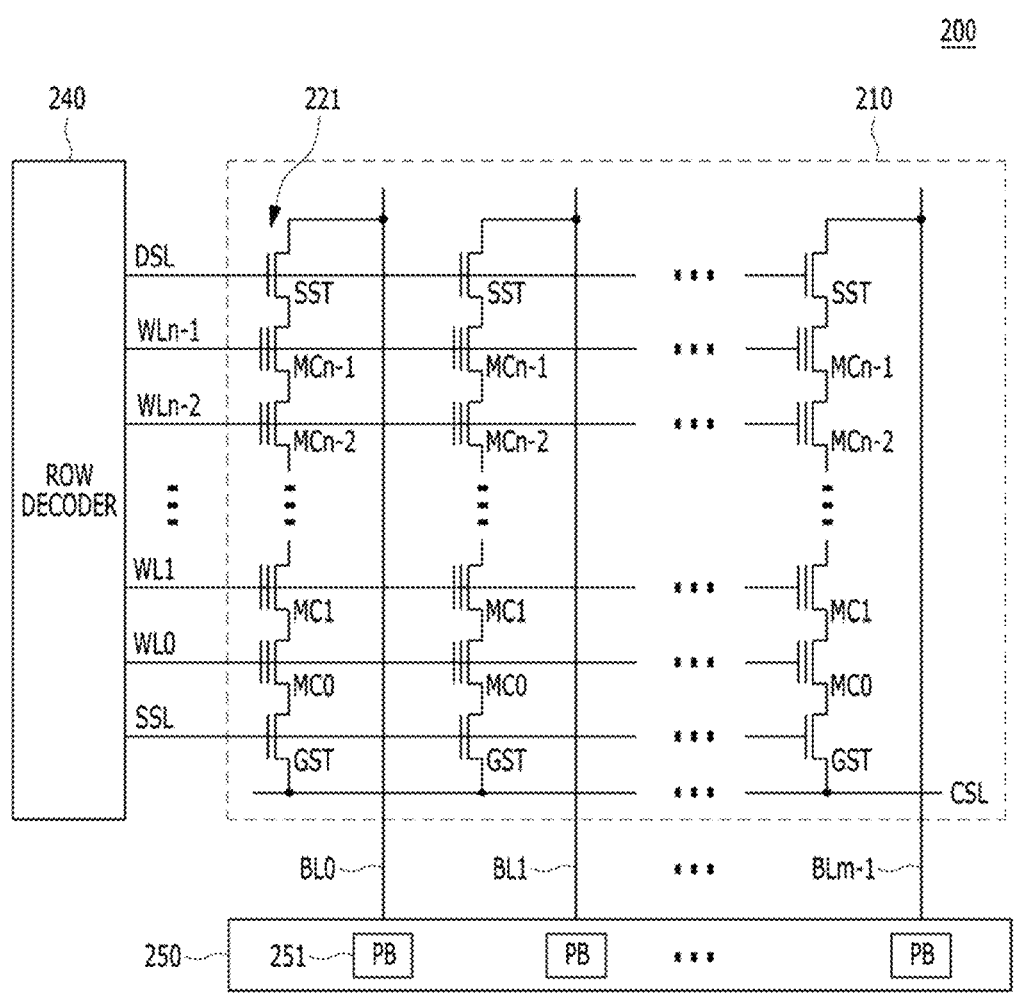
FIG. 2 is a block diagram illustrating a memory block shown in FIG. 1.

FIG. 2 is a block diagram illustrating the memory block 210 of the semiconductor memory device 200 shown in FIG. 1. FIG. 2 shows a memory cell array circuit.

Referring to FIG. 2, the memory block 210 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST.

Each of the memory cells MC0 to MCn−1 may be formed of a multi-level cell (MLC) storing data information of a single bit of data or multiple bits of data in each cell. The strings 221 may be electrically coupled to the corresponding bit lines BL0 to BLm−1, respectively.

Figure 3:
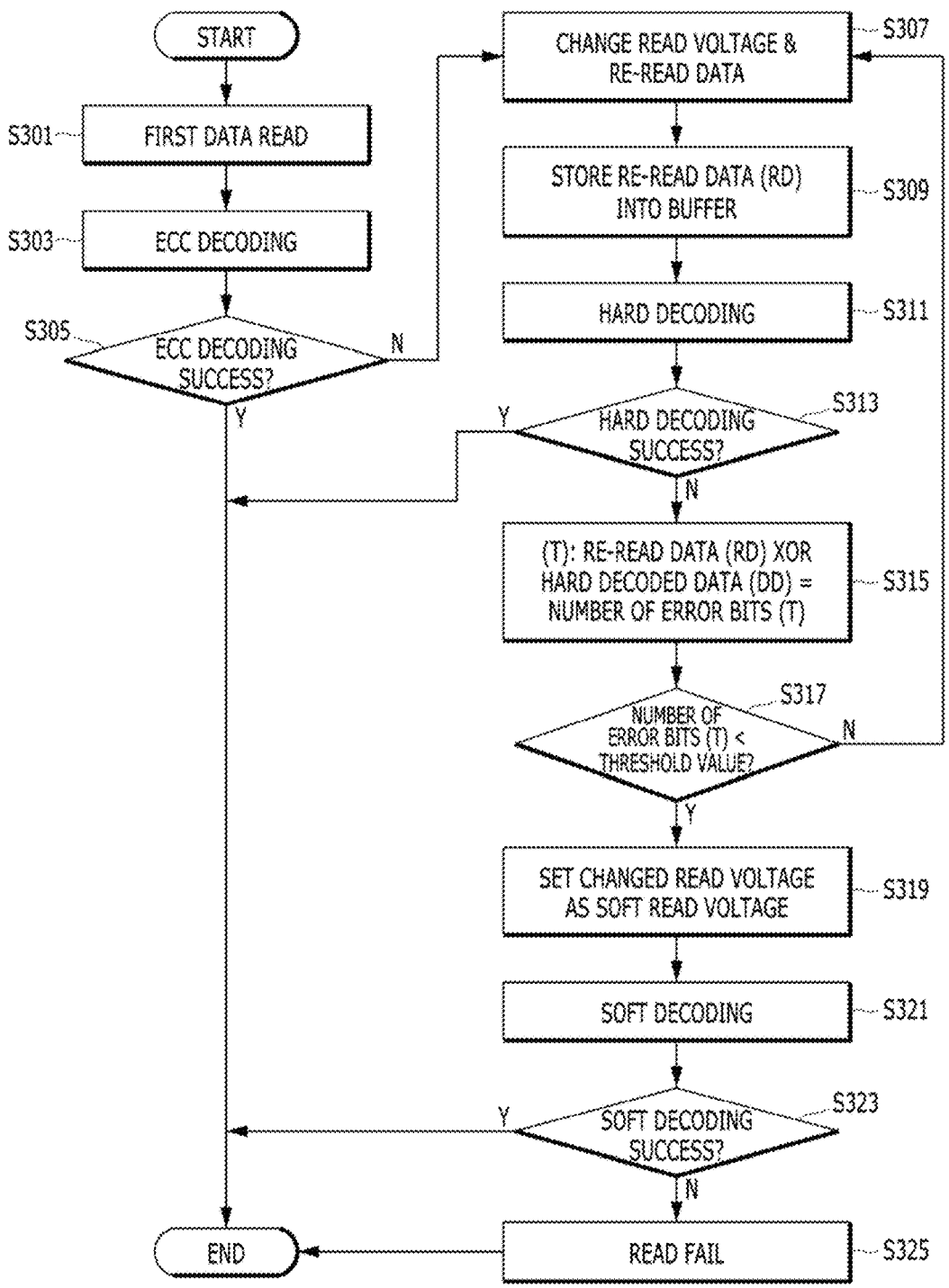
FIG. 3 is a flow chart illustrating an operation of a semiconductor memory system shown in FIG. 1 according to an embodiment of the present invention.

FIG. 3 is a flow chart illustrating an operation of the semiconductor memory system 110 shown in FIG. 1 according to an embodiment.

Referring to FIG. 3, at step S301, the memory controller 120 may read first data from the memory block 210 of the semiconductor memory device 200 using a first read voltage. The memory controller 120 may perform the ECC decoding operation to the first data read from the memory block 210 for error detection and error correction of the first data read from the memory block 210 at step S303. Then, at step S305, the memory controller 120 may determine whether or not the ECC decoding operation of the step S303 is successful.

When the memory controller 120 determines that the ECC decoding operation of the step S303 is successful at step S305, the memory controller 120 may provide the ECC-decoded first data to the host 100.

However, the ECC decoding operation of the step S303 may fail.

When the memory controller 120 determines that the ECC decoding operation of the step S303 fails at step S305, the memory controller 120 may change the first read voltage to a second read voltage and then re-read the first data from the memory block 210 of the semiconductor memory device 200 using the second read voltage at step S307. The first data re-read from the memory block 210 of the semiconductor memory device 200 using the second read voltage is stored as second data.

Step S307 may be repeated a number of times which will be described later. The first read voltage and the second read voltage may be determined in various ways. In an embodiment, the second read voltage may be obtained by changing that is, increasing or decreasing, the first read voltage by a fixed increment. In another embodiment, the second read voltage may be selected from a preset read voltage table.

At step S309, the memory controller 120 may store the re-read data RD as the second data in the buffer.

At step S311, the memory controller 120 may perform a hard decoding to the second data also referred to as re-read data RD, which is re-read at step S307.

At step S313, the memory controller 120 may determine whether or not the hard decoding operation of the step S311 is successful. The hard decoded data is stored as third data.

When the memory controller 120 determines that the hard decoding operation of the step S311 is successful at step S313, the memory controller 120 may provide the third data also referred to as hard decoded data DD, to the host 100.

However, the hard decoding operation of the step S311 may fail.

When the memory controller 120 determines that the hard decoding operation of the step S311 fails at step S313, the memory controller 120 may store the third data that is, the hard decoded data DD, into a buffer.

At step S315, the memory controller 120 may perform the exclusive OR operation to the second data that is, the re-read data RD, and the third data that is, the hard decoded data DD, and count the number T of error bits. The number T of error bits are the number of bits of the second data (the re-read data RD) and the third data (the hard decoded data DD) that are different from each other.

At step S317, the memory controller 120 may compare the number T of error bits with a predetermined threshold value, and determine whether or not the number T of error bits is smaller than the predetermined threshold value.

When it is determined that the number T of error bits is the same as or greater than the predetermined threshold value at step S317, the memory controller 120 may change the second read voltage and repeat steps S307 to S317 until the number T of error bits is smaller than the predetermined threshold value.

When it is determined that the number T of error bits is smaller than the predetermined threshold value at step S317, the memory controller 120 may set the currently changed second read voltage as a soft read voltage at step S319. It will be described with reference to FIG. 6 that the currently changed second read voltage according to the number T of error bits obtained through the exclusive OR operation to the second data (or the re-read data RD) and the third data (or the hard decoded data DD) is set as an optimal read voltage. The currently changed second data is set as an optimal read data.

The memory controller 120 may perform soft decoding operation to the optimal read data at step S321. The soft decoded data is stored as fourth data. The memory controller 120 may determine whether or not the soft decoding operation of the step S321 is successful at step S323.

When the memory controller 120 determines that the soft decoding operation of the step S321 is successful at step S323, the memory controller 120 may provide the fourth data (also referred to as the soft decoded data) to the host 100.

When the memory controller 120 determines that the soft decoding operation of the step S321 falls at step S323, the memory controller 120 may provide a read failure signal to the host 100 at step S325 since the optimal read data (or the currently changed second data) that is re-read using the optimal read voltage has low reliability.

Figure 4:
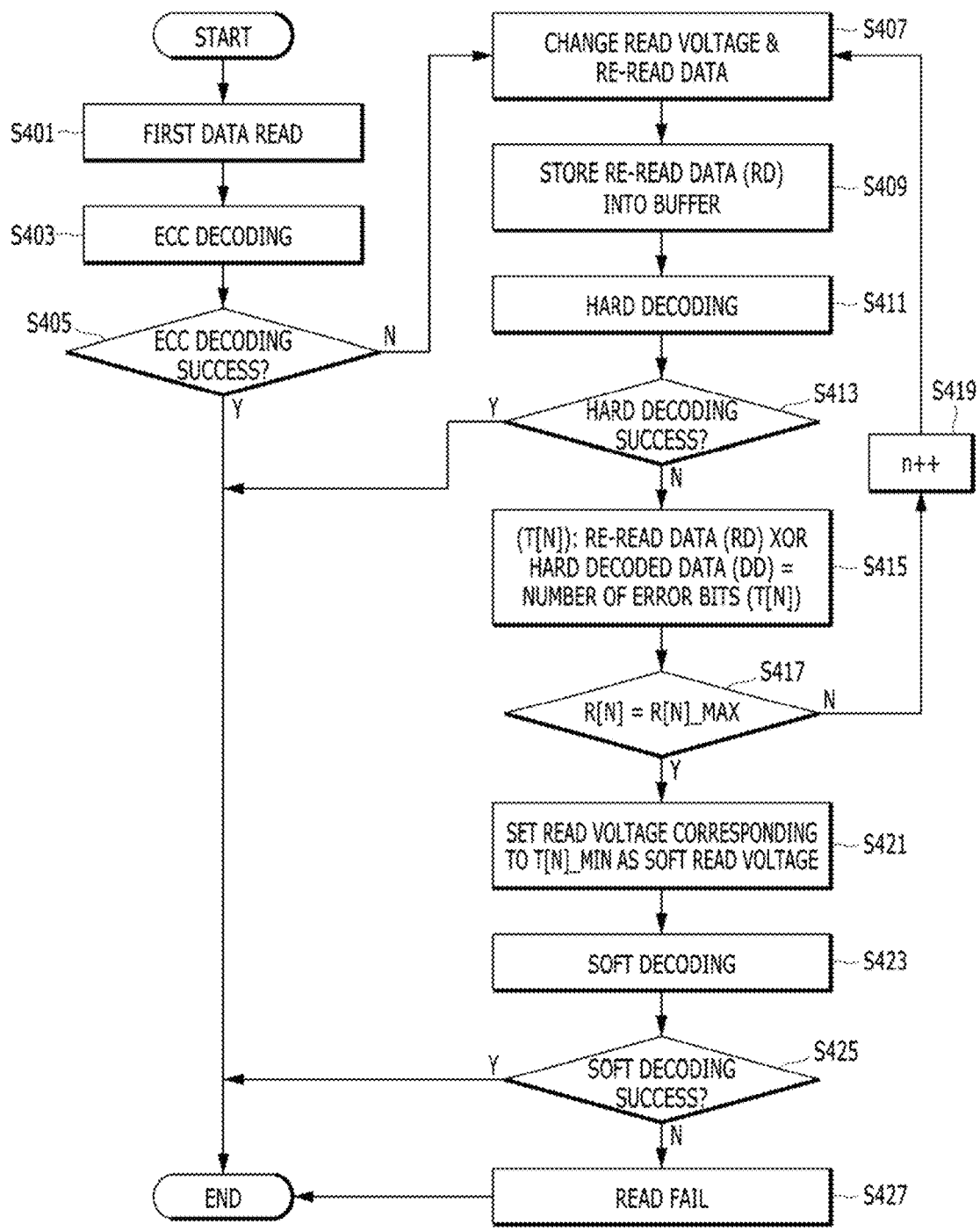
FIG. 4 is a flow chart illustrating an operation of a semiconductor memory system shown in FIG. 1 according to another embodiment of the present invention.

FIG. 4 is a flow chart illustrating an operation of the semiconductor memory system 110 shown in FIG. 1.

Referring to FIG. 4, at step S401, the memory controller 120 may read first data from the memory block 210 of the semiconductor memory device 200 using a first read voltage.

The memory controller 120 may perform the ECC decoding operation to the first data read from the memory block 210 for error detection and error correction of the data read from the memory block 210 at step S403, and then may determine whether or not the ECC decoding operation of the step S403 is successful at step S405.

When the memory controller 120 determines that the ECC decoding operation of the step S403 is successful at step S405, the memory controller 120 may provide the ECC-decoded first data to the host 100.

However, the ECC decoding operation of the step S403 may fall. In accordance with an embodiment of the present invention, in order to find an optimal read voltage, the memory controller 120 may perform the read operation R[n] a predetermined number R[n]_max of times while changing the read voltage. The changed read voltage is referred to as a second read voltage and may be determined in various ways. For example, the first read voltage may be changed by a fixed amount of voltage variation, or In another embodiment, the second read voltage is selected according to a preset read voltage table. In accordance with an embodiment of the present invention, the second read voltage may be changed with the fixed amount of the voltage variation.

When the memory controller 120 determines that the ECC decoding operation of the step S403 fails at step S405, the memory controller 120 may change the first read voltage to the second read voltage and then perform the read operation R[n] to re-read the first data from the memory block 210 of the semiconductor memory device 200 using the second read voltage at step S407. The re-read data is stored as second data.

At step S407, the second read voltage may be determined in various ways. For example, at step S407, the first read voltage may be changed by a fixed amount of the voltage variation.

At step S409, the memory controller 120 may store the second read data (also referred to as re-read data RD[n]) which is the result of the read operation R[n] in the buffer.

At step S411, the memory controller 120 may perform a hard decoding to the second data (or the re-read data RD[n]), which is re-read at step S407. The hard-decoded second data is stored as third data.

At step S413, the memory controller 120 may determine whether or not the hard decoding operation of the step S411 is successful.

When the memory controller 120 determines that the hard decoding operation of the step S411 is successful at step S413, the memory controller 120 may provide the third data (also referred to as hard decoded data DD[n]) to the host 100.

However, the hard decoding operation of the step S411 may fail.

When the memory controller 120 determines that the hard decoding operation of the step S411 fails at step S413, the memory controller 120 may store the third data (or the hard decoded data DD[n]) in a buffer.

At step S415, the memory controller 120 may perform exclusive OR operation to the second data (or the re-read data RD[n]) and the third data (or the hard decoded data DD[n]), and count a number T[n] of error bits in which the bits of the second data (or the re-read data RD[n]) and the third data (or the hard decoded data DD[n]) are different from each other.

At step S417, the memory controller 120 may check the repetition number R[n] of the read operation, and compare the repetition number R[n] of the read operation with the predetermined number R[n]_max of times.

When the repetition number R[n] of the read operation is not the same as the predetermined number R[n]_max of times, the memory controller 120 may increase the repetition number R[n] of the read operation (n++) at step S419 and repeat the read operation R[n] from step S407 a predetermined number of times until the repetition number R[n] of the read operation is the same as the predetermined number R[n]_max of times.

When the repetition number R[n] of the read operation is the same as the predetermined number R[n]_max of times, the memory controller 120 may perform step S421 since the memory controller 120 has performed the read operation R[n] the predetermined number R[n]_max of times.

At step 421, the memory controller 120 may select a second read voltage at which the number T[n] of error bits is the smallest and a minimum number T[n]_min of error bits among a plurality of numbers T[1] to T[n] of error bits which are obtained through the exclusive OR operation between a plurality of re-read data RD[1] to RD[n] and a plurality of hard decoded data DD[1] to DD[n] using the changed read voltage at step S407 during the repetition of the read operation R[n] as much as the predetermined number R[n]_max of times. The memory controller 120 may set the read voltage corresponding to the minimum number T[n]_min of error bits among the plurality of numbers T[1] to T[n] of error bits as the soft read voltage.

The memory controller 120 may determine the read voltage corresponding to the minimum number T[n]_min of error bits in various ways. For example, while the memory controller 120 performs the read operation R[n] the predetermined number R[n]_max of times, the memory controller 120 may compare a first number T[1] of error bits, which is obtained through the exclusive OR operation to the first re-read data RD[1] and the first hard decoded data DD[1] according to a first read voltage, and a second number T[2] of error bits, which is obtained through the exclusive OR operation to the second re-read data RD[2] and the second hard decoded data DD[2] according to a second read voltage. The memory controller 120 may determine the read voltage corresponding to the minimum number T[n]_min of error bits based on the comparison. When the second number T[2] of error bits is smaller than the first number T[1] of error bits, the memory controller 120 may determine the second number T[2] of error bits as the minimum number T[n]_min of error bits. Such comparison and determination may be repeated on the plurality of numbers T[1] to T[n] of error bits during the repetition of the read operation R[n] as much as the predetermined number R[n]_max of times.

The memory controller 120 may perform a soft decoding operation for the error detection and the error correction on the re-read data RD[n] according to the read voltage corresponding to the minimum number T[n]_min of error bits at step S423, and then may determine whether or not the soft decoding operation of the step S423 is successful at step S425.

When the memory controller 120 determines that the soft decoding operation of the step S423 is successful at step S425, the memory controller 120 may provide the soft decoded data to the host 100.

When the memory controller 120 determines that the soft decoding operation of the step S423 fails at step S425, the memory controller 120 may provide the read failure signal to the host 100 at step S427 since the re-read data RD[n] that is re-read according to the read voltage corresponding to the minimum number T[n]_min of error bits has low reliability.

Figure 5:
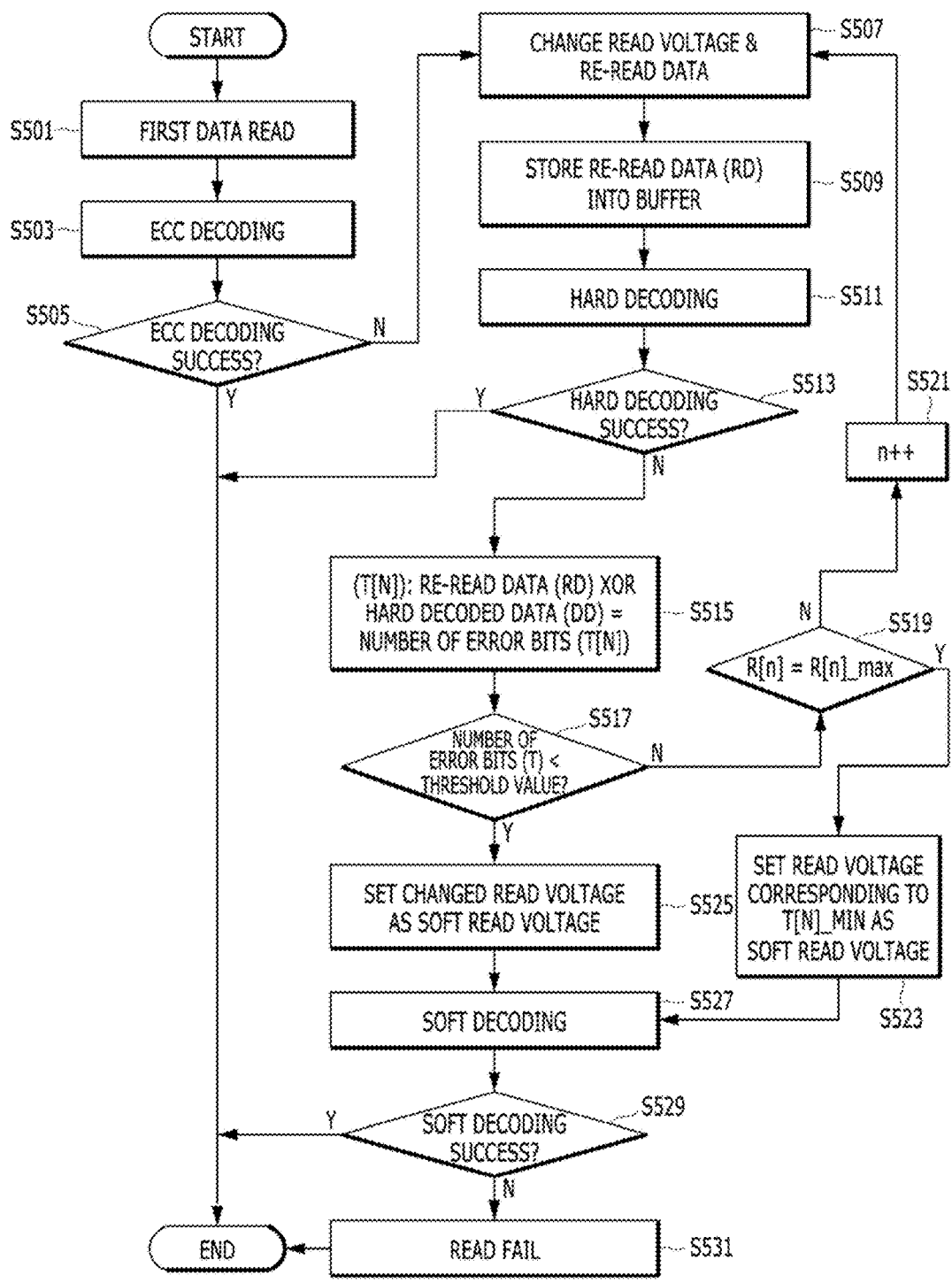
FIG. 5 is a flow chart Illustrating an operation of a semiconductor memory system shown in FIG. 1 according to yet another embodiment of the present invention.

FIG. 5 is a flow chart illustrating an operation of the semiconductor memory system 110 shown in FIG. 1.

Referring to FIG. 5, at step S501, the memory controller 120 may read data from the memory block 210 of the semiconductor memory device 200 using a read voltage.

The memory controller 120 may perform the ECC decoding operation to the data read from the memory block 210 for the error detection and the error correction of the data read from the memory block 210 at step S503, and then may determine whether or not the ECC decoding operation of the step S503 is successful at step S505.

When the memory controller 120 determines that the ECC decoding operation of the step S503 is successful at step S505, the memory controller 120 may provide the ECC-decoded data to the host 100.

However, the ECC decoding operation of the step S503 may fail. In accordance with an embodiment of the present invention, to set the optimal read voltage, the memory controller 120 may perform the read operation R[n] a predetermined number R[n]_max of times while changing the read voltage. The memory controller 120 may compare a number T[n] of error bits, which are bits different between the re-read data RD[n] and the hard decoded data DD[n] obtained during the repetition of the read operation R[n] as much as the predetermined number R[n]_max of times, with a predetermined threshold value. When the number T[n] of error bits is smaller than the predetermined threshold value, a current read voltage may be set as a soft read voltage even though the read operation R[n] to be repeated remains until the predetermined number R[n]_max of times.

When the memory controller 120 determines that the ECC decoding operation of the step S503 fails at step S505, the memory controller 120 may change the read voltage and then perform the read operation for the re-read of the data from the memory block 210 of the semiconductor memory device 200 using the changed read voltage at step S507. Step S507 may be repeated a number of times which will be described later. The changed read voltage may be determined in various ways. For example, the read voltage may be changed with fixed amount of voltage variation, or according to a preset read voltage table. At step S507, the initial read voltage may be predetermined, and the read voltage may be changed with the fixed amount of the voltage variation.

At step S509, the memory controller 120 may store the re-read data RD[n] which is the result of the read operation R[n] into the buffer.

At step S511, the memory controller 120 may perform a hard decoding to the re-read data RD[n], which is re-read at step S507.

At step S513, the memory controller 120 may determine whether or not the hard decoding operation of the step S511 is successful.

When the memory controller 120 determines that the hard decoding operation of the step S511 is successful at step S513, the memory controller 120 may provide the hard decoded data to the host 100.

However, the hard decoding operation of the step S511 may fail.

When the memory controller 120 determines that the hard decoding operation of the step S511 fails at step S513, the memory controller 120 may store the hard decoded data DD[n] into a buffer.

At step S515, the memory controller 120 may perform the exclusive OR operation to the re-read data RD[n] and the hard decoded data DD[n], and count a number T[n] of error bits which are bits different between the re-read data RD[n] and the hard decoded data DD[n].

At step S517, the memory controller 120 may compare the number T[n] of error bits with a predetermined threshold value, and determine whether or not the number T[n] of error bits is smaller than the predetermined threshold value.

When it is determined that the number T[n] of error bits is smaller than the predetermined threshold value at step S517, the memory controller 120 may set the currently changed read voltage as the soft read voltage at step S525 even though the read operation R[n] to be repeated remains until the predetermined number R[n]_max of times.

The memory controller 120 may perform soft decoding operation at step S527, and then may determine whether or not the soft decoding operation of the step S527 is successful at step S529.

When the memory controller 120 determines that the soft decoding operation of the step S527 is successful at step S529, the memory controller 120 may provide the soft decoded data to the host 100.

When the memory controller 120 determines that the soft decoding operation of the step S527 fails at step S529, the memory controller 120 may provide the read failure signal to the host 100 at step S531 since the re-read data that is re-read according to the changed read voltage has low reliability.

When it is determined that the number T[n] of error bits is greater than the predetermined threshold value at step S517, the memory controller 120 may check the repetition number R[n] of the read operation, and compare the repetition number R[n] of the read operation with a predetermined number R[n]_max of times at step S519.

When the repetition number R[n] of the read operation is determined not to be the same as the predetermined number R[n]_max of times at step S519, the memory controller 120 may increase the repetition number R[n] of the read operation (n++) at step S521 and repeat the read operation R[n] from step S507 until the number T[n] of error bits is smaller than the predetermined threshold value.

When the repetition number R[n] of the read operation is determined to be the same as the predetermined number R[n]_max of times at step S519, the memory controller 120 may perform step S523 since the memory controller 120 has performed the read operation R[n] the predetermined number R[n]_max of times.

When the repetition number R[n] of the read operation is determined not to be the same as the predetermined number R[n]_max of times at step S519 despite of the repetition of the read operation R[n] as much as the predetermined number R[n]_max of times, at step 523, the memory controller 120 may determine a read voltage corresponding to the minimum number T[n]_min of error bits among the plurality of numbers T[1] to T[n] of error bits which are obtained through the exclusive OR operation between the plurality of re-read data RD[1] to RD[n] and the plurality of hard decoded data DD[1] to DD[n] using the changed read voltage at step S507 during the repetition of the read operation R[n] as much as the predetermined number R[n]_max of times. The memory controller 120 may set the read voltage corresponding to the minimum number T[n]_min of error bits among the plurality of numbers T[1] to T[n] of error bits as the soft read voltage.

The memory controller 120 may perform soft decoding operation for the error detection and the error correction on the re-read data RD[n] according to the read voltage corresponding to the minimum number T[n]_min of error bits at step S527, and then may determine whether or not the soft decoding operation of the step S527 is successful at step S529.

When the memory controller 120 determines that the soft decoding operation of the step S527 is successful at step S529, the memory controller 120 may provide the soft decoded data to the host 100.

When the memory controller 120 determines that the soft decoding operation of the step S527 fails at step S529, the memory controller 120 may provide the read failure signal to the host 100 at step S531 since the re-read data RD[n] that is re-read according to the read voltage corresponding to the minimum number T[n]_min of error bits has low reliability.

Figure 6:
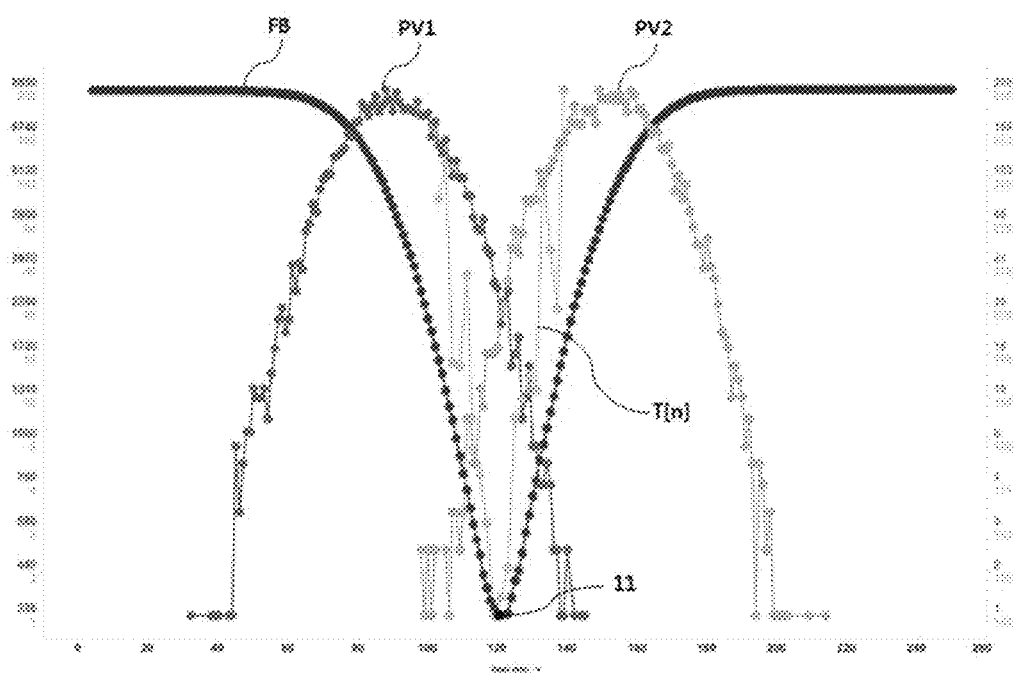
FIG. 6 is a graph illustrating an operation of a semiconductor memory system shown in FIG. 1.

FIG. 6 is a graph illustrating an operation of a semiconductor memory system shown in FIG. 1. FIG. 6 shows simulation result that the currently changed read voltage in accordance with an embodiment of the present invention may be set as the optimal read voltage.

Referring to FIG. 6, a first voltage status PV1 and a second voltage status PV2 of a memory cell overlap each other due to distortion of the threshold voltage distribution. Dotted line of FIG. 6 shows real number FB of error bits included in the data read from the memory cell having the first and second voltage statuses PV1 and PV2 according to read voltages.

Referring to the real number FB of error bits of FIG. 6, the minimum number 11 of error bits is included in the overlapping voltage region of the first and second voltage statuses PV1 and PV2.

Considering the plurality of numbers T[1] to T[n] of error bits which are obtained through the exclusive OR operation between the plurality of second data (re-read data RD[1] to RD[n]) and the plurality of third data (hard decoded data DD[1] to DD[n]) and using the read voltage in the overlapping voltage region of the first and second voltage statuses PV1 and PV2 in accordance with an embodiment of the present invention, distribution of the plurality of numbers T[1] to T[n] of error bits is similar to the distribution of the real number FB of error bits. FIG. 6 shows that the read voltage corresponding to the minimum number T[n]_min among the plurality of numbers T[1] to T[n] of error bits is similar to the read voltage corresponding to the minimum number 11 of the real number FB of error bits.

That is, the distribution of the plurality of numbers T[1] to T[n] of error bits is similar to the distribution of the real number FB of error bits in the overlapping voltage region of the first and second voltage statuses PV1 and PV2. Therefore, data may be reliably read from the memory cell using the read voltage corresponding to the number T of error bits obtained through the exclusive OR operation between the read data and the hard decoded data.

The semiconductor memory device 200 included in the semiconductor memory system which is implemented with 3-dimensional nonvolatile memory device will be described hereinafter with reference to FIGS. 7 to 14.

FIGS. 7 to 11 are diagrams schematically illustrating the three-dimensional (3D) nonvolatile memory device 200 in accordance with an embodiment of the present invention. FIGS. 9 to 13 illustrate the semiconductor memory device, for example a flash memory device implemented in 3D in accordance with an embodiment of the present invention.

Figure 7:
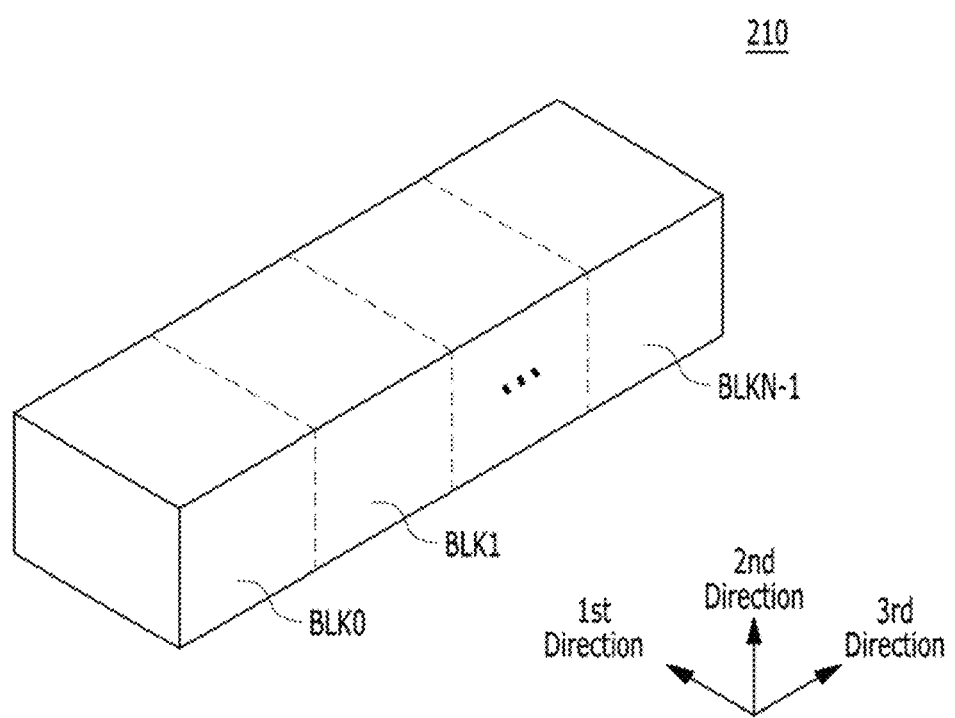
FIGS. 7 to 11 are diagrams schematically illustrating a three-dimensional (3D) nonvolatile memory device in accordance with an embodiment of the present invention.

FIG. 7 is a block diagram of the memory block 210 shown in FIG. 1.

Referring to FIG. 7, the semiconductor memory device 200 may include a plurality of memory blocks BLKO to BKLn-1, where n is an integer. FIG. 7 shows the memory block 210 of the semiconductor memory device 200 shown in FIG. 2. Each of the plurality of memory blocks BLKO to BKLn-1 may have a 3D structure or a vertical structure. For example, each of the plurality of memory blocks BLKO to BKLn-1 may include structures extending along 1st to 3rd directions, for example, the x, y, and z directions.

Each of the plurality memory blocks BLKO to BKLn-1 may include a plurality of NAND strings NS extending along the 2nd direction. In another embodiment, the plurality of NAND strings NS may be provided along the 1st or 3rd direction. Each of NAND strings NS may be coupled to a bit line BL, one or more string select lines SSL, one or more ground select lines GSL, a plurality of word lines WL, one or more dummy word line DWL, and a common source line CSL. That is, each of the plurality of memory blocks BLKO to BKLn-1 may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 8:
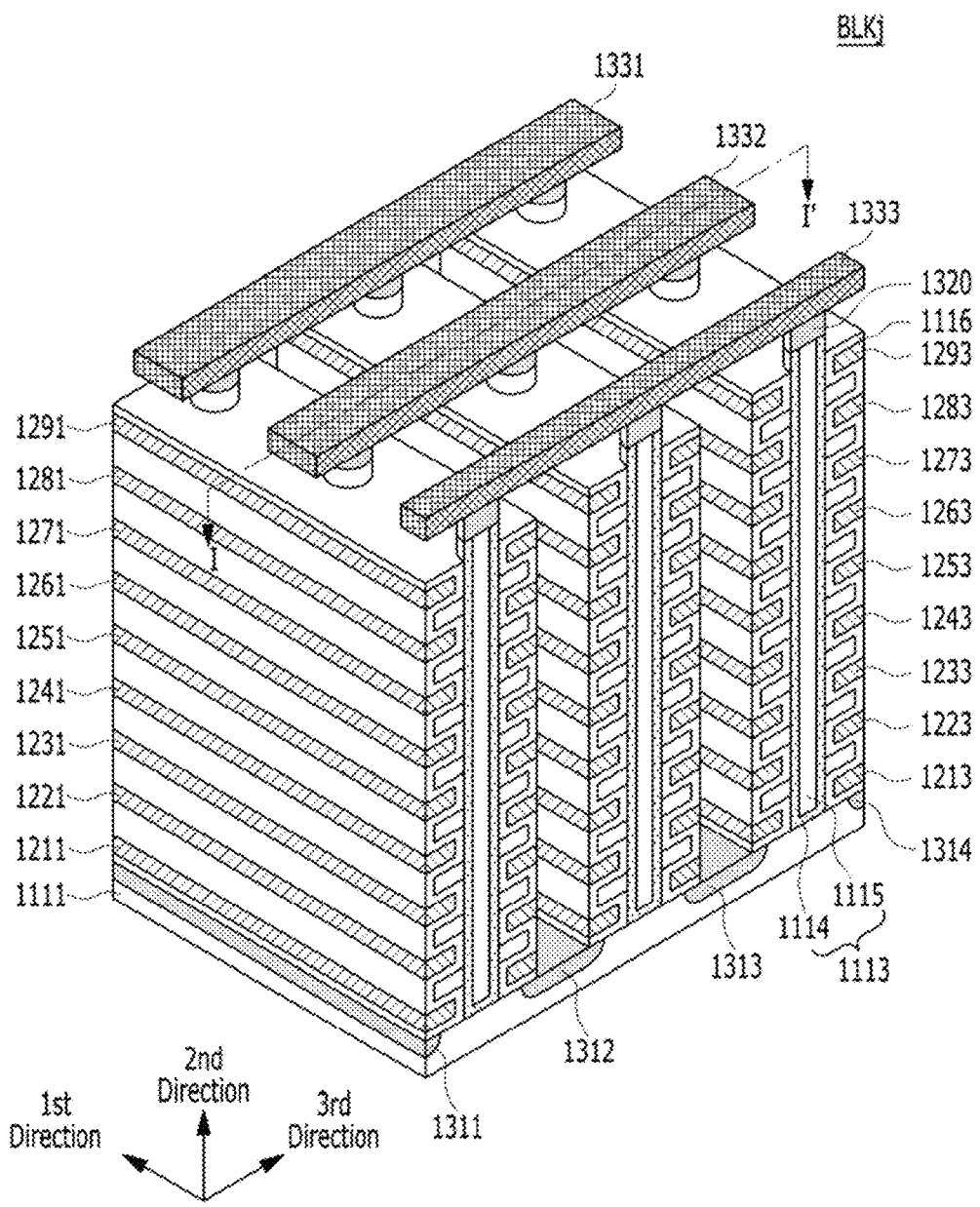

FIG. 8 is a perspective view of a single memory block BLKj, where j is an integer between 0 to n-1, selected among the plurality of memory blocks BLKO to BKLn-1 shown in FIG. 7. FIG. 11 is a cross-sectional view taken along a line I-I' of the memory block BLKj shown in FIG. 10.

A substrate 1111 may be provided. For example, the substrate 1111 may include a silicon material doped by 1st type impurity. For example, the substrate 1111 may include a silicon material doped by p-type impurity or a p-type well for example, a pocket p-well. The substrate 1111 may further include an n-type well surrounding the p-type well. In an embodiment, the substrate 1111 is a p-type silicon. However, the substrate 1111 will not be limited to the p-type silicon.

A plurality of doping regions 1311 to 1314 extending along the 1st direction may be provided on the substrate 1111. For example, the plurality of doping regions 1311 to 1314 may have a 2nd type dopant differing from that of the substrate 1111. For example, the plurality of doping regions 1311 to 1314 may be of n-type regions. In an embodiment, the 1st to 4th doping regions 1311 to 1314 are of n-type regions. However, the 1st to 4th doping regions 1311 to 1314 will not be limited to the n-type regions.

A plurality of insulation materials 1112 (see FIG. 9) extending along the 1st direction may be sequentially provided along the 2nd direction over a region of the substrate 1111 between the 1st and 2nd doping regions 1311 and 1312. For example, the plurality of insulation materials 1112 and the substrate 1111 may be provided along the 2nd direction such that they are spaced apart by a predetermined distance. For example, the plurality of insulation materials 1112 may be provided to be spaced apart from each other along the 2nd direction. For example, the insulation materials 1112 may include an insulator such as silicon oxide.

A plurality of pillars 1113 may be sequentially provided along the 1st direction on a region of the substrate 1111 between the 1st doping region 1311 and the 2nd doping region 1312, and may be formed to penetrate the insulation materials 1112 along the second direction. For example, each of the plurality of pillars 1113 may penetrate the insulation materials 1112 to contact with the substrate 1111. For example, each of the plurality of pillars 1113 may be composed of a plurality of materials. For example, a surface layer 1114 of each of the plurality of pillars 1113 may include a silicon material having a 1st type dopant. For example, the surface layer 1114 of each of the plurality of pillars 1113 may include a silicon material doped with the same type as that of the substrate 1111. In an embodiment, the surface layer 1114 of each of the plurality of pillars 1113 includes p-type silicon. However, the surface layer 1114 of each of plurality of pillars 1113 will not be limited to include the p-type silicon.

An inner layer 1115 of each of the plurality of pillars 1113 may be formed of an insulation material. For example, the inner layer 1115 of each of the plurality of pillars 1113 may be filled with an insulation material such as silicon oxide.

In a region between the 1st and 2nd doping regions 1311 and 1312, an insulation layer 1116 may be provided along exposed surfaces of the insulation materials 1112, the pillars 1113, and the substrate 1111. For example, the thickness of the insulation material 1116 may be less than half of the distance between the insulation materials 1112. That is, a region in which a material other than the insulation materials 1112 and the insulation layer 1116 is disposed, may be provided between the insulation layer 1116 provided under surface of the 1st insulation material of the insulation materials 1112 and the insulation layer 1116 provided over surface of the 2nd insulation material under the 1st insulation material.

In the region between the 1st and 2nd doping regions 1311 and 1312, conductive materials 1211 to 1291 may be provided on an exposed surface of the insulation layer 1116. For example, the conductive material 1211 extending along the 1st direction may be provided between the substrate 1111 and the plurality of insulation materials 1112 adjacent to the substrate 1111. More specifically, the conductive material 1211 extending along the 1st direction may be provided between the substrate 1111 and the insulation layer 1116 disposed under the insulation materials 1112 adjacent to the substrate 1111.

A conductive material extending along the 1st direction may be provided between the insulation layer 1116 over a specific insulation material among the insulation materials 1112 and the insulation layer 116 disposed under an insulation layer provided over the specific insulation material. For example, a plurality of conductive materials 1221 to 1281 extending along the 1st direction may be provided between the insulation materials 1112. Also, a conductive material 1291 extending along the 1st direction may be provided on the insulation materials 1112. For example, the conductive materials 1211 to 1291 extending along the 1st direction may be a metallic material. For example, the conductive materials 1211 to 1291 extending along the 1st direction may be a conductive material such as polysilicon.

The same structure as disposed on the 1st and 2nd doping regions 1311 and 1312 may be provided between the 2nd and 3rd doping regions 1312 and 1313. For example, the plurality of insulation materials 1112 extending along the 1st direction, the plurality of pillars 1113 which are sequentially arranged in the 1st direction and penetrate the plurality of insulation materials 1112 along the 3rd direction, the insulation layer 1116 provided on exposed surfaces of the plurality of insulation materials 1112 and the plurality of pillars 1113, and the plurality of conductive materials 1212 to 1292 extending along the 1st direction may be provided between the 2nd and 3rd doping regions 1312 and 1313.

The same structure as disposed on the 1st and 2nd doping regions 1311 and 1312 may be provided between the 3rd and 4th doping regions 1313 and 1314. For example, the plurality of insulation materials 1112 extending along the 1st direction, the plurality of pillars 1113 which are sequentially arranged in the 1st direction and penetrate the plurality of insulation materials 1112 along the 3rd direction, the insulation layer 1116 provided on exposed surfaces of the plurality of insulation materials 1112 and the plurality of pillars 1113, and the plurality of conductive materials 1213 to 1293 extending along the 1st direction may be provided.

Drains 1320 may be provided on the plurality of pillars 1113, respectively. For example, the drains 1320 may be a silicon material doped with a 2nd type material. For example, the drains 1320 may be a silicon material doped with an n-type material. In an embodiment, the drains 1320 are a silicon material doped with an n-type material. However, the drains 1320 will not be limited to n-type silicon materials. For example, a width of the drains 1320 may be wider than that of a corresponding one of the plurality of pillars 1113. For example, the drains 1320 may be provided on a top surface of the corresponding one of the plurality of pillars 1113 in a pad shape.

Conductive materials 1331 to 1333 extending in the 3rd direction may be provided on the drains 1320. The conductive materials 1331 to 1333 may be sequentially disposed along the 1st direction. The conductive materials 1331 to 1333 may be respectively coupled to the drains 1320 in the corresponding region. For example, the drains 1320 and the conductive material 1333 extending along the 3rd direction may be coupled to each other through contact plugs, respectively. For example, the conductive materials 1331 to 1333 extending along the 3rd direction may be a metallic material. For example, the conductive materials 1331 to 1333 may be a conductive material such as polysilicon.

Figure 9:
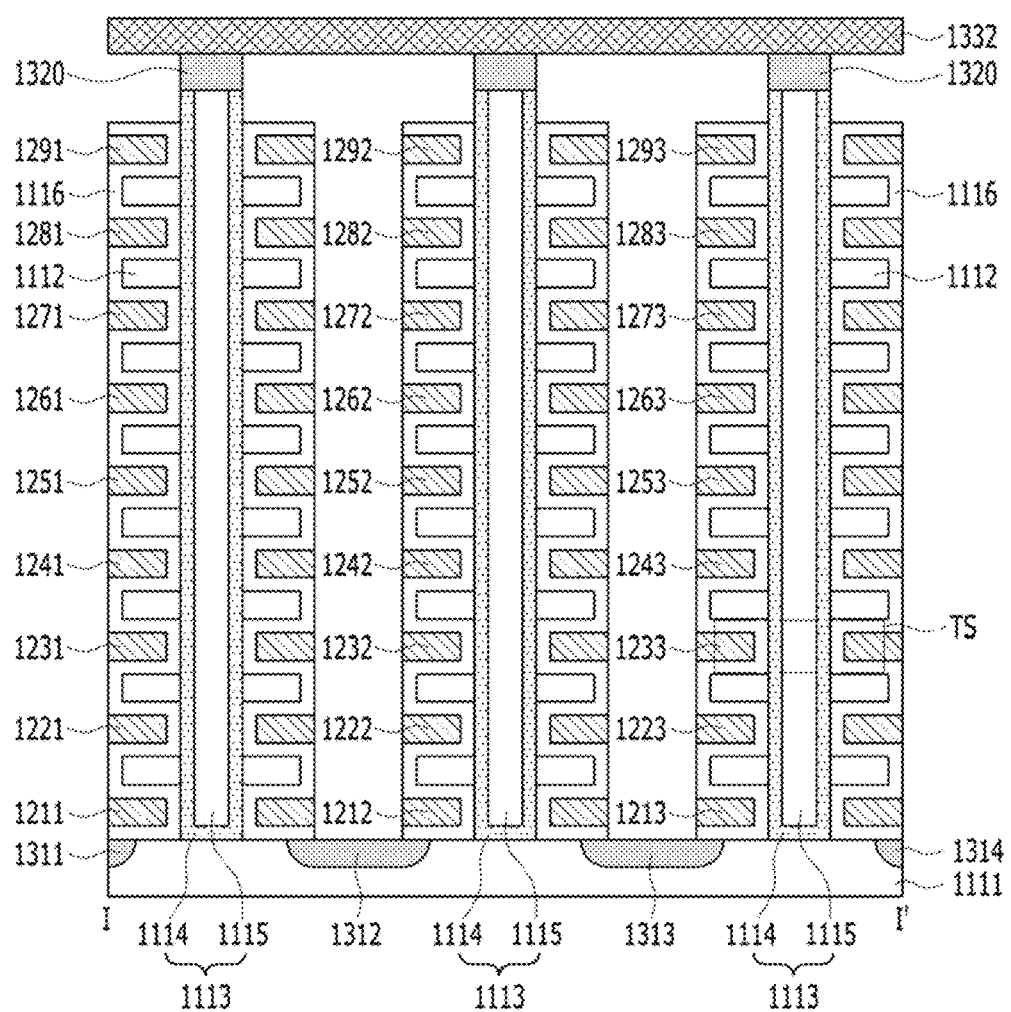

Referring to FIGS. 8 and 9, each of the plurality of pillars 1113 may form a string together with an adjacent region of the insulation layer 1116 and an adjacent region among the plurality of conductive materials 1211 to 1291, 1212 to 1292, and 1213 to 1293 extending along the 1st direction. For example, each of the plurality of pillars 1113 may form a NAND string NS together with an adjacent region to the insulation layer 1116 and an adjacent region among the conductive materials 1211 to 1291, 1212 to 1292, and 1213 to 1293 extending along the 1st direction. The NAND string NS may include a plurality of transistor structures TS.

Figure 10:
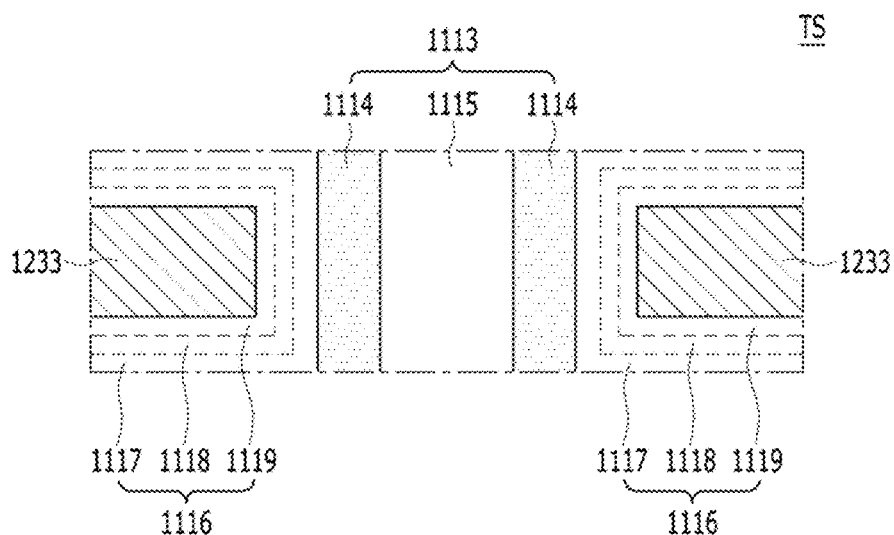
Figure 11:
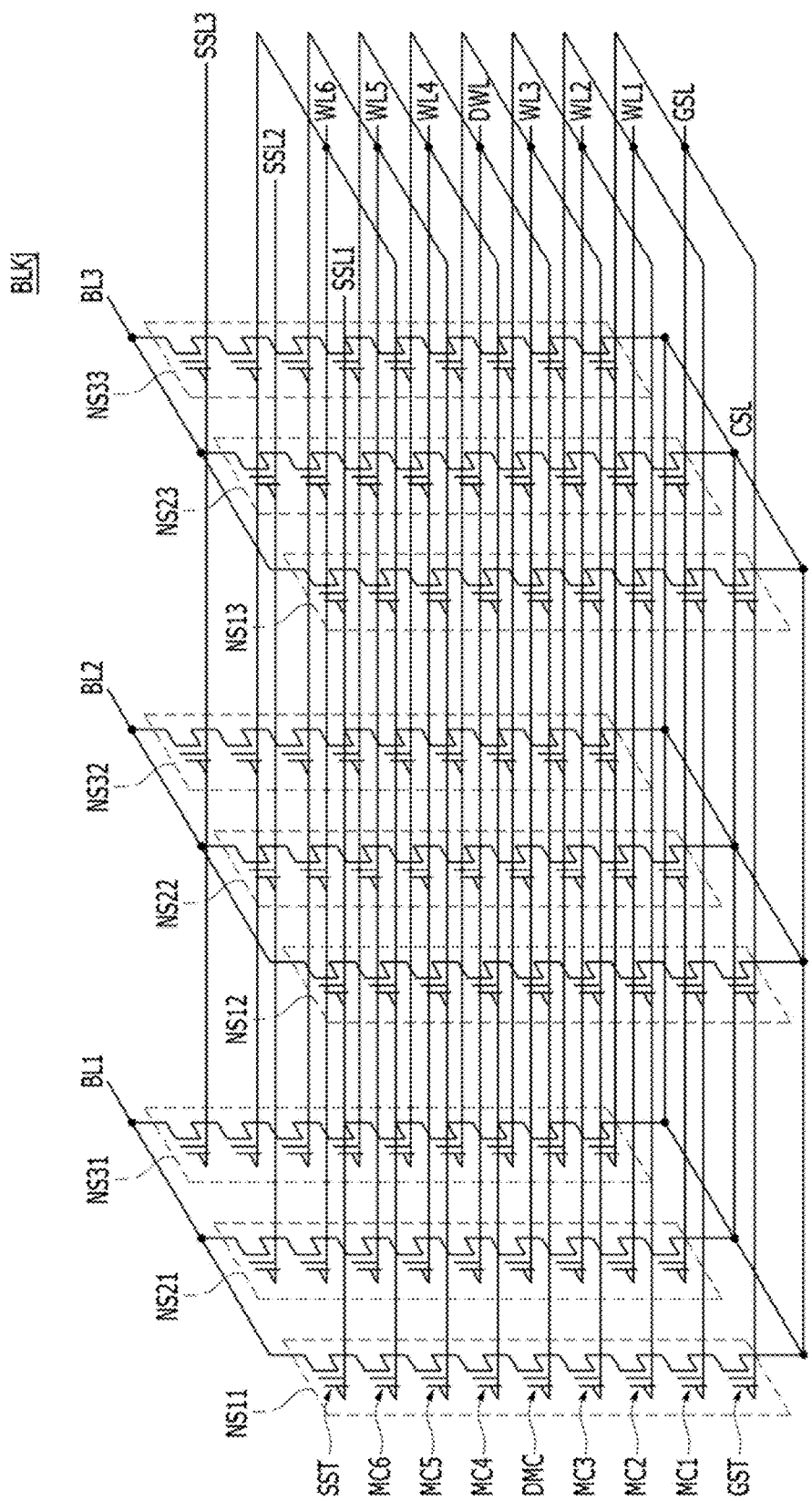

FIG. 10 is a cross-sectional view of a transistor structure TS shown in FIG. 9.

Referring to FIG. 10, the insulation layer 1116 may include 1st to 3rd sub insulation layers 1117, 1118 and 1119.

P-type silicon 114 of each of the plurality of pillars 1113 may serve as a body. A 1st sub insulation layer 1117 adjacent to each of the plurality of pillars 1113 may serve as a tunnelling insulation layer. For example, the 1st sub insulation layer 1117 adjacent to the each of the plurality of pillars 1113 may include a thermal oxide layer.

A 2nd sub insulation layer 1118 may serve as a charge storage layer. For example, the 2nd sub insulation layer 1118 may serve as a charge trap layer. For example, the 2nd sub insulation layer 1118 may include a nitride layer or a metal oxide layer for example, aluminium oxide layer, hafnium oxide layer, etc.

A 3rd sub insulation layer 1119 adjacent to a conductive material 1233 may serve as a blocking insulation layer. For example, the 3rd sub insulation layer 1119 adjacent to the conductive material 1233 extending along the 1st direction may have a mono-layered or multi-layered structure. The 3rd sub insulation layer 1119 may be a high dielectric layer for example, aluminium oxide layer, hafnium oxide layer, etc., having a higher dielectric constant than the 1st and 2nd sub insulation layers 1117 and 1118.

The conductive material 1233 may act as a gate or control gate. That is, the gate or control gate 233, the blocking insulation layer 1119, the charge trap layer 1118, the tunnelling insulation layer 1117, and the body 1114 may form a transistor or memory cell transistor structure. For example, the 1st to 3rd sub insulation layers 1117 to 1119 may form an oxide-nitride-oxide (ONO) structure. In the description, the p-type silicon 1114 of each of the plurality of pillars 1113 may be referred to as a body in the 2nd direction.

The memory block BLKj may include the plurality of pillars 1113. That is, the memory block BLKj may Include the plurality of NAND strings NS. More specifically, the memory block BLKj may include the plurality of NAND strings NS extending along the 2nd direction or a direction perpendicular to the substrate.

Each of the NAND strings NS may include the plurality of transistor structures TS which are stacked in the 2nd direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the 1st direction. That is, the gates or control gates may extend along the 1st direction to form word lines WL and two or more select lines such as, one or more string select line SSL and one or more ground select line GSL.

The conductive materials 1331 to 1333 extending along the 3rd direction may be coupled to one end of the NAND strings NS. For example, the conductive materials 1331 to 1333 extending along the 3rd direction may serve as bit lines BL. That is, in one memory block BLKj, a single bit line BL may be coupled to the plurality of NAND strings.

The 2nd type doping regions 1311 to 1314 extending along the 1st direction may be provided at the other ends of the NAND strings NS. The 2nd type doping regions 1311 to 1314 extending along the 1st direction may serve as common source lines CSL.

As mentioned above, the memory block BLKj may include the plurality of NAND strings NS extending along a direction (2nd direction) perpendicular to the substrate 1111, and may operate as a NAND flash memory block, for example, of charge trap type in which the plurality of NAND strings NS is coupled to a single bit line BL.

With reference to FIGS. 8 to 10, it is described that the conductive materials 1211 to 1291, 1212 to 1292, and 1213 to 1293 extending along the 1st direction are stacked to form 9 layers. However, the 1st conductive materials 1211 to 1291, 1212 to 1292, and 1213 to 1293 extending along the 1st direction will not be limited to 9 layers. For example, the conductive materials extending along the 1st direction may be provided upon 8, 16 or more layers. That is, a NAND string may include 8, 16 or more transistors.

With reference to FIGS. 8 to 10, 3 NAND strings NS are coupled to a single bit line BL. However, the present invention will not be limited to 3 NAND strings NS coupled to a single bit line BL. For example, in the memory block BLKj, m number of NAND strings NS, where m is an integer, may be coupled to a single bit line BL. Here, the number of the conductive materials 1211 to 1291, 1212 to 1292, and 1213 to 1293 extending along the 1st direction and the number of common source lines 311 to 314 may vary corresponding to the number of NAND strings NS coupled to a single bit line BL.

With reference to FIGS. 8 to 10, 3 NAND strings NS are coupled to a single conductive material extending along the 1st direction. However, the present invention will not be limited to 3 NAND strings NS coupled to a single conductive material. For example, n number of NAND strings NS where n is an integer, may be coupled to a single conductive material. Here, the number of the conductive materials 1331 to 1333 extending along the 3rd direction may vary corresponding to the number of NAND strings NS coupled to a single conductive material.

FIG. 11 is an equivalent circuit diagram illustrating the memory block BLKj described with reference to FIGS. 8 to 10.

Referring to FIGS. 8 to 11, NAND strings NS11 to NS41 may be provided between a 1st bit line BL1 and a common source line CSL. The 1st bit line BL1 may correspond to the conductive material 1331 extending along the 3rd direction. NAND strings NS12, NS22 and NS42 may be provided between a 2nd bit line BL2 and the common source line CSL. The 2nd bit line BL1 may correspond to the conductive material 1332 extending along the 3rd direction. NAND strings NS13, NS23 and NS43 may be provided between a 3rd bit line BL3 and the common source line CSL. The 3rd bit line BL3 may correspond to a conductive material 1333 extending along the 3rd direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS 31 coupled to the 1st bit line BL1 may correspond to a 1st column. The NAND strings NS12 to NS 32 coupled to the 2nd bit line BL2 may correspond to a 2nd column. The NAND strings NS13 to NS 33 coupled to the 3rd bit line BL3 may correspond to a 3rd column. The NAND strings NS coupled to a single string select line SSL may form a single row. For example, the NAND strings NS11 to NS13 coupled to a 1st string select line SSL1 may form a 1st row. The NAND strings NS21 to NS23 coupled to a 2nd string select line SSL2 may form a 2nd row. The NAND strings NS31 to NS33 coupled to a 3rd string select line SSL3 may form a 3rd row.

A height that is, thickness, may be defined for each NAND string NS. For example, the height that is, thickness, of the ground select transistor GST may be defined as 1 in each NAND string NS. In each NAND string NS, the closer to the string selection transistor SST, the higher the height of the memory cell. In each NAND string NS, the height of the memory cell MC6 adjacent to the string select transistor SST may be defined as 6.

The string select transistors SST of the NAND strings NS of the same row may share the string select line SSL. The string select transistors SST of the NAND strings NS in different rows may be coupled with different string select lines SSL1, SSL2, and SSL3, respectively.

The memory cells MC having the same height that is, the same level, in the NAND strings NS of the same row may share the word line WL. At a predetermined height or level, the word line WL may be shared by the memory cells MC of the NAND strings NS of different rows. At a predetermined height, dummy memory cells DMC of the NAND strings NS of the same row may share a dummy word line DWL. The dummy memory cells DMC of the NAND strings NS in different rows but at the same level or the same height may share the dummy word lines DWL.

For example, the word lines WL located at the same level may be commonly coupled to each other. Likewise, the dummy word lines DWL located at the same level may be commonly coupled to each other. For example, the conductive materials 1211 to 1291, 1212 to 1292, and 1213 to 1293 extending in the 1st direction may be coupled to an upper layer via a contact. The conductive materials 1211 to 1291, 1212 to 1292, and 1213 to 1293 extending in the 1st direction may be coupled in common at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS 33 may be coupled in common to the same ground select line GSL.

The common source line CSL may be commonly coupled to the NAND strings NS. For example, the 1st to 4th doping regions 1311 to 1314 may be coupled to each other at an active region of the substrate 1111. For example, the 1st to 4th doping regions 1311 to 1314 may be coupled to an upper layer via a contact. The 1st to 4th doping regions 1311 to 1314 may be coupled in common at the upper layer.

As illustrated in FIG. 11, the word lines WL of the same height may be commonly coupled to each other. Therefore, when a word line WL with a specific height is selected, all of the NAND strings NS coupled to the selected word line WL may be selected. The NAND strings NS of different rows may be coupled to different string select lines SSL. Accordingly, among the NAND strings NS coupled to the same word line WL, the NAND strings NS of the unselected row may be electrically isolated from the bit lines BL1 to BL3 through selection of the string selection lines SSL1 to SSL3. That is, a single specific row of the NAND strings NS may be selected by selecting the string select lines SSL1 to SSL3. The NAND strings NS of the selected row may be further subject to selection of the bit lines BL1 to BL3 to select a single specific NAND string NS.

In each NAND string NS, the dummy memory cell DMC may be provided. In an embodiment, the 1st to 3rd memory cells MC1 to MC3 may be provided between the dummy memory cell DMC and the ground select transistor GST.

The 4th to 6th memory cells MC4 to MC6 may be provided between the dummy memory cell DMC and the string select transistor SST. In an embodiment, the memory cells MC in each NAND string NS are divided into memory cell groups by the dummy memory cell DMC. A memory cell group such as, MC1 to MC3, adjacent to the ground select transistor GST among the memory cell groups may be referred to as a lower memory cell group. A memory cell group such as, MC4 to MC6, adjacent to the string select transistor SST among the memory cell groups may be referred to as an upper memory cell group.

An operating method of the semiconductor memory system 110 which includes one or more cell strings each arranged in a direction perpendicular to a substrate coupled with the memory controller 120 and including memory cells, a string select transistor and a ground select transistor will be described with reference to FIGS. 7 to 11. In an embodiment, the semiconductor memory system 110 may be provided with a 1st read command to perform 1st and 2nd hard decision read operations using a 1st hard decision read voltage and a 2nd hard decision read voltage which is different from the 1st hard decision read voltage, may form hard decision data, may select a particular one of the 1st and 2nd hard decision voltages based on an error bit state of the hard decision data, may form soft decision data using a soft read voltage which is different from the 1st and 2nd hard decision read voltages, and provide the soft decision data to the memory controller 120.

Figure 12:
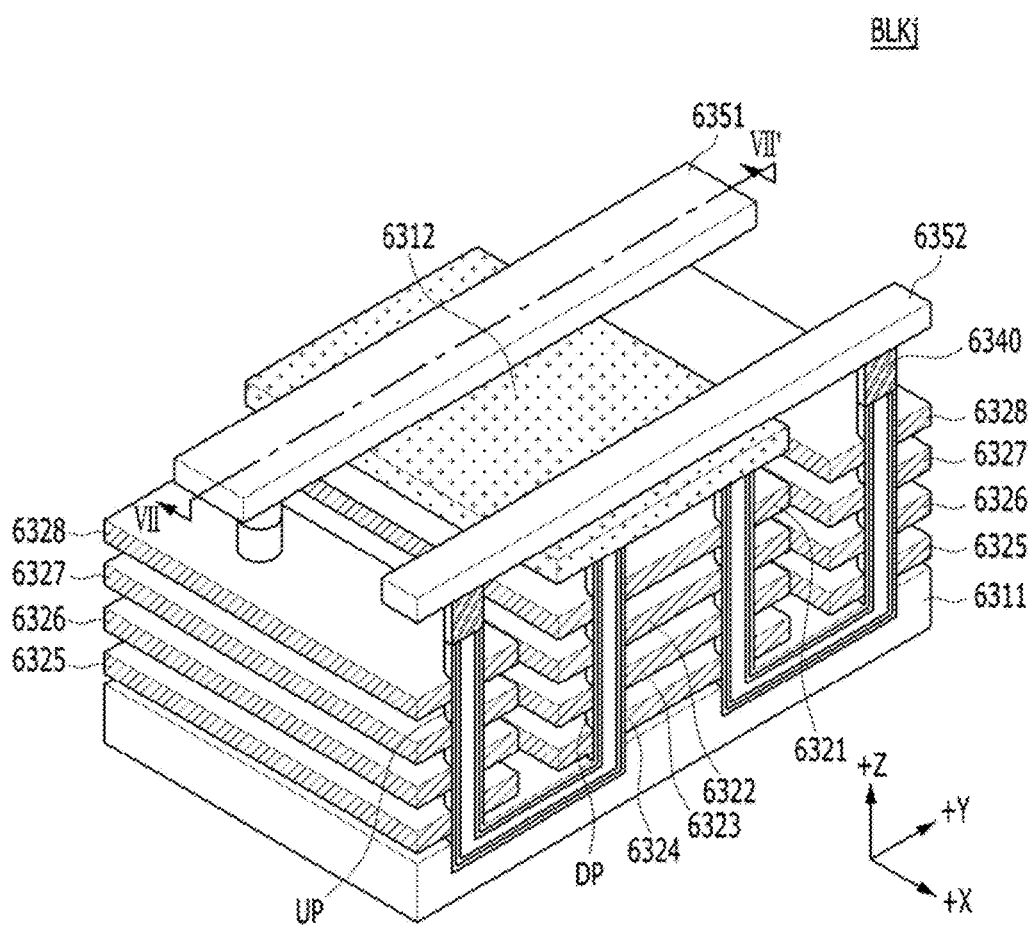
FIGS. 12 to 14 are diagrams schematically illustrating a 3D nonvolatile memory device in accordance with an embodiment of the present invention.
Figure 13:
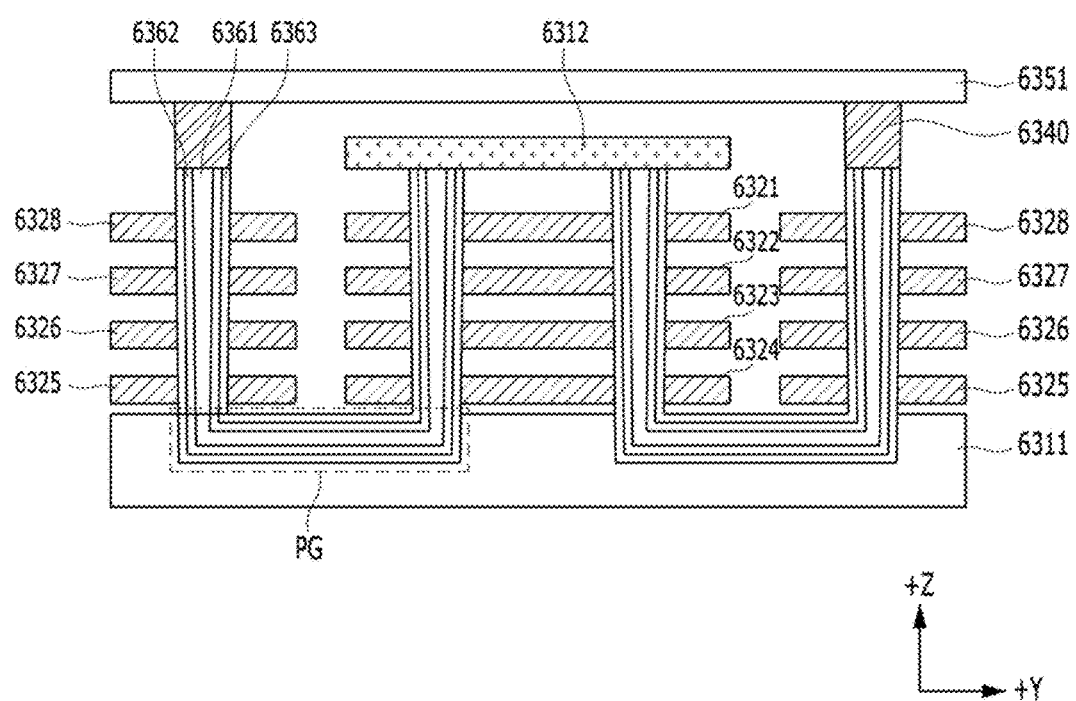
Figure 14:
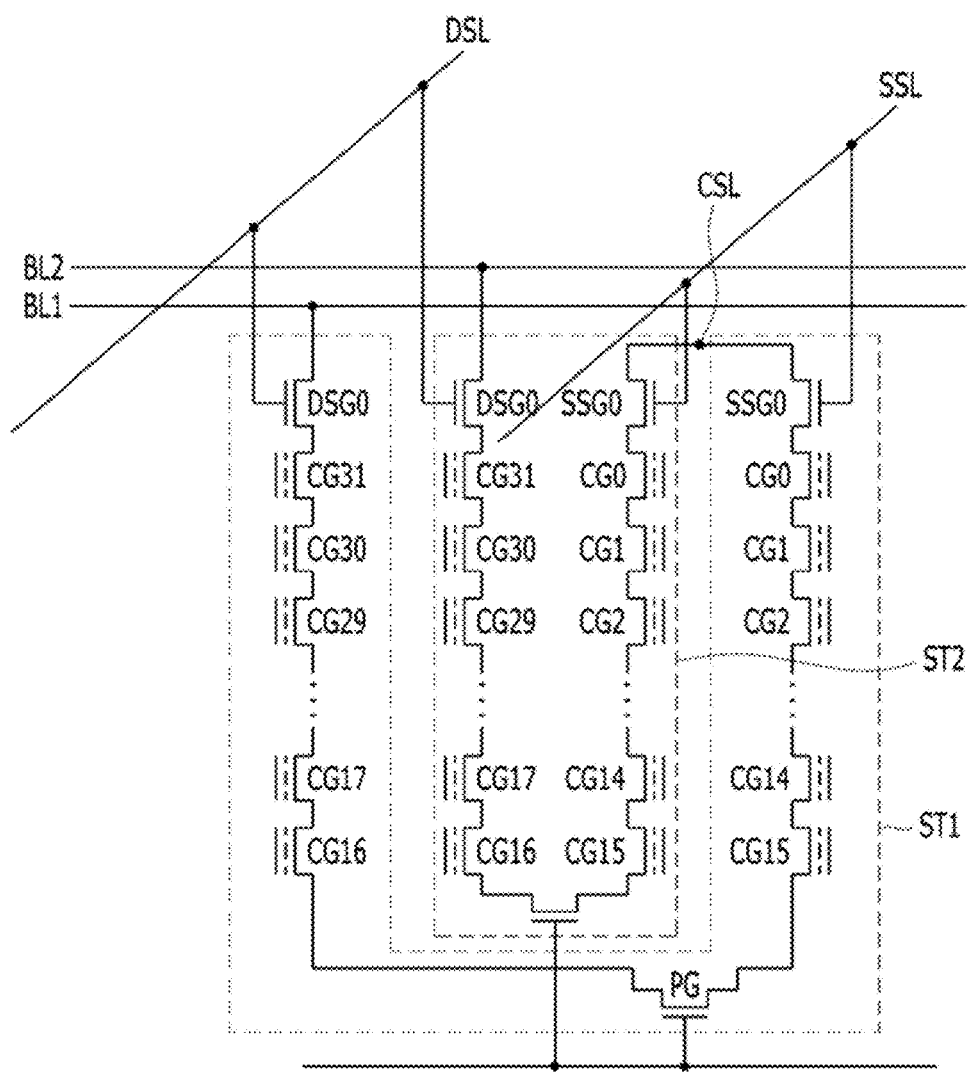

FIGS. 12 to 14 are diagrams schematically illustrating a 3D nonvolatile memory device 200 in accordance with another embodiment of the present invention. FIGS. 12 to 14 illustrate the semiconductor memory system 110, for example the flash memory device 200 implemented in 3D in accordance with another embodiment of the present invention.

FIG. 12 is a perspective view illustrating one BLKj of the memory blocks shown in FIG. 7. FIG. 13 is a sectional view Illustrating the memory block BLKj taken along the line VII-VII' shown in FIG. 14.

Referring to FIGS. 12 and 13, the memory block BLKj may include structures extending along 1st to 3rd directions.

A substrate 6311 may be provided. For example, the substrate 6311 may include a silicon material doped with a 1st type impurity. For example, the substrate 6311 may include a silicon material doped by a p-type impurity or a p-type well for example, a pocket p-well. The substrate 6311 may further include an n-type well surrounding the p-type well. In an embodiment, the substrate 6311 is a p-type silicon. However, the substrate 6311 will not be limited to the p-type silicon.

1st to a 4th conductive material layers 6321 to 6324 extending along the X-direction and the Y-direction may be disposed on the substrate 6311. The 1st to 4th conductive material layers 6321 to 6324 may be spaced from one another in the Z-direction.

5th to a 8th conductive material layers 6325 to 6328 extending along the X-direction and the Y-direction may be disposed on the substrate 6311. The 5th to 8th conductive material layers 6325 to 6328 may be spaced from one another in the Z-direction. The 5th to 8th conductive material layers 6325 to 6328 may be spaced from the 1st to 4th conductive material layers 6321 to 6324 in the Y-direction.

A plurality of lower pillars DP may be formed through the 1st to 4th conductive material layers 6321 to 6324. Each of the plurality of lower pillars DP may be extended in the Z-direction. A plurality of upper pillars UP may be formed through the 5th to 8th conductive material layers 6325 to 6328. Each of the plurality of upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer and a tunnel insulating layer.

The plurality of lower pillars DP and the plurality of upper pillars UP may be coupled through a pipe gate PG. The pipe gate PG may be formed in the substrate 6311. For example, the pipe gate PG may include substantially the same material as the plurality of lower pillars DP and the plurality of upper pillars UP.

A doping material layer 6312 with a 2nd impurity may be disposed on the plurality of lower pillars DP. The doping material layer 6312 may extend in the X direction and the Y direction. For example, the doping material layer 6312 with the 2nd impurity may include n-type silicon material. The doping material layer 6312 with the 2nd Impurity may serve as the common source line CSL.

Drains 6340 may be formed on each of the plurality of upper pillars UP. For example, the drain 6340 may include n-type silicon material. 1st and 2nd upper conductive material layers 6351 and 6352 may be formed on the drains 6340. The 1st and 2nd upper conductive material layers 6351 and 6352 may be extended in the Y-direction.

The 1st and 2nd upper conductive material layers 6351 and 6352 may be spaced apart from each other in the X-direction. For example, the 1st and 2nd upper conductive material layers 6351 and 6352 may be made up of metal. For example, the 1st and 2nd upper conductive material layers 6351 and 6352 may be coupled to drains 6340 through contact plugs. The 1st and 2nd upper conductive material layers 6351 and 6352 may serve as 1st and 2nd bit lines BL1 and BL2, respectively.

The 1st conductive material layer 6321 may serve as the source select line SSL, the 2nd conductive material layer 6322 may serve as the 1st dummy word line DWL1, and the 3rd and 4th conductive material layers 6323 and 6324 may serve as the 1st and 2nd main word lines MWL1 and MWL2, respectively. The 5th and 6th conductive material layers 6325 and 6326 may serve respectively as the 3rd and 4th main word lines MWL3 and MWL4, the 7th conductive material layer 6327 may serve as the 2nd dummy word line DWL2, and the 8th conductive material layer 6328 may serve as the drain select line DSL.

Each of the plurality of lower pillars DP and the 1st to 4th conductive material layers 6321 to 6324 adjacent to the lower pillar DP may form a lower string. Each of the plurality of upper pillars UP and the 5th to 8th conductive material layers 6325 to 6328 adjacent to the upper pillar UP may form an upper string. The lower string and the upper string may be coupled through the pipe gate PG. One end of the lower string may be coupled to the 2nd-type doping material layer 6312 serving as the common source line CSL. One end of the upper string may be coupled to a corresponding bit line through the drain 6320. The lower string and the upper string are coupled to each other through the pipe gate PG. A single lower string and a single upper string may form a single cell string coupled between the 2nd-type doping material layer 6312 and corresponding bit line.

That is, the lower string may include the source select transistor SST, the 1st dummy memory cell DMC1, and the 1st and 2nd main memory cells MMC1 and MMC2. The upper string may include the 3rd and 4th main memory cells MMC3 and MMC4, the 2nd dummy memory cell DMC2 and the drain select transistor DST.

Referring to FIGS. 12 and 13, the upper string and the lower string may form the NAND string NS having a plurality of transistor structures TS. The structure of the transistor TS may be the same as described with reference to FIG. 7.

FIG. 14 is an equivalent circuit diagram illustrating the memory block BLKj described with reference to FIGS. 12 and 13. FIG. 14 illustrates first and second strings among the strings included in the memory block BLKj according to an embodiment.

Referring to FIG. 14, the memory block BLKj may include a plurality of cell strings, each of which comprises a single upper string and a single lower string coupled to each other through the pipe gate PG, as described with reference to FIGS. 12 and 13.

In the memory block BLKj, memory cells stacked along a first channel layer CH1, one or more source selection gates, and one or more drain selection gates may form a first string ST1. Memory cells stacked along a second channel layer CH2, one or more source selection gates, and one or more drain selection gates may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 14 shows the first and second strings ST1 and ST2 coupled to a single drain selection line DSL via the drain selection gate DSG0 and a single source selection line SSL via the source selection gate SSG0. The first and second strings ST1 and ST2 may be coupled to bit lines BL1 and BL2, respectively. In another embodiment, the first string ST1 may be coupled to the first drain selection line DSL1, and the second string ST2 may be coupled to the second drain selection line DSL2. In another embodiment, the first and second strings ST1 and ST2 may be commonly coupled to the same drain selection line DSL and a single bit line BL. In such case, the first string ST1 may be coupled to the first source selection line SSL1, and the second string ST2 may be coupled to the second source selection line SSL2.

Figure 15:
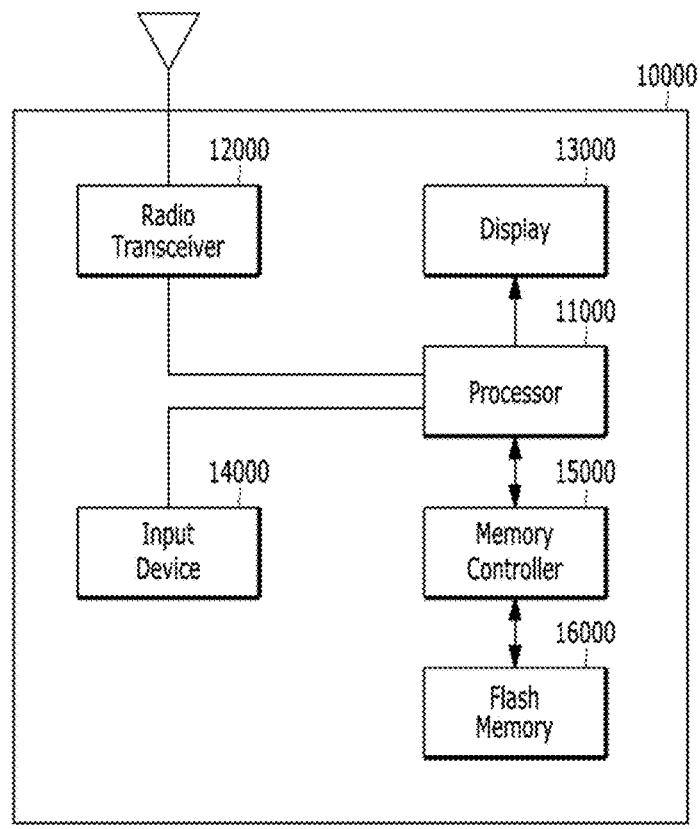
FIG. 15 is a block diagram schematically illustrating an electronic device including a semiconductor memory system in accordance with an embodiment of the present invention.

FIG. 15 is a block diagram schematically Illustrating an electronic device 10000 including a memory controller 15000 and a flash memory device 16000 in accordance with an embodiment of the present invention.

Referring to FIG. 15, the electronic device 10000 such as a cellular phone, a smart phone, or a tablet PC may include the flash memory device 16000 implemented by the flash memory device 200 and the memory controller 15000 to control the flash memory device 16000.

The flash memory device 16000 may correspond to the semiconductor memory device 200 described above with reference to FIGS. 1 to 13. The flash memory device 16000 may store random data.

The memory controller 15000 may be controlled by a processor 11000 which controls an overall operation of the electronic device 10000.

Data stored at the flash memory device 16000 may be displayed through a display 13000 under a control of the memory controller 15000 which operates under a control of the processor 11000.

A radio transceiver 12000 may exchange a radio signal through an antenna ANT. For example, the radio transceiver 12000 may convert a received radio signal from the antenna ANT into a signal to be processed by the processor 11000. Thus, the processor 11000 may process the converted signal from the radio transceiver 12000, and may store the processed signal at the flash memory device 16000. Otherwise, the processor 11000 may display the processed signal through the display 13000.

The radio transceiver 12000 may convert a signal from the processor 11000 into a radio signal, and may output the converted radio signal to an external device (not shown) through the antenna ANT.

An input device 14000 may receive a control signal for controlling an operation of the processor 11000 or data to be processed by the processor 11000, and may be implemented by a pointing device such as a touch pad, a computer mouse, a key pad, or a keyboard.

The processor 11000 may control the display 13000 such that data from the flash memory device 16000, a radio signal from the radio transceiver 12000 or data from the input device 14000 is displayed through the display 13000.

Figure 16:
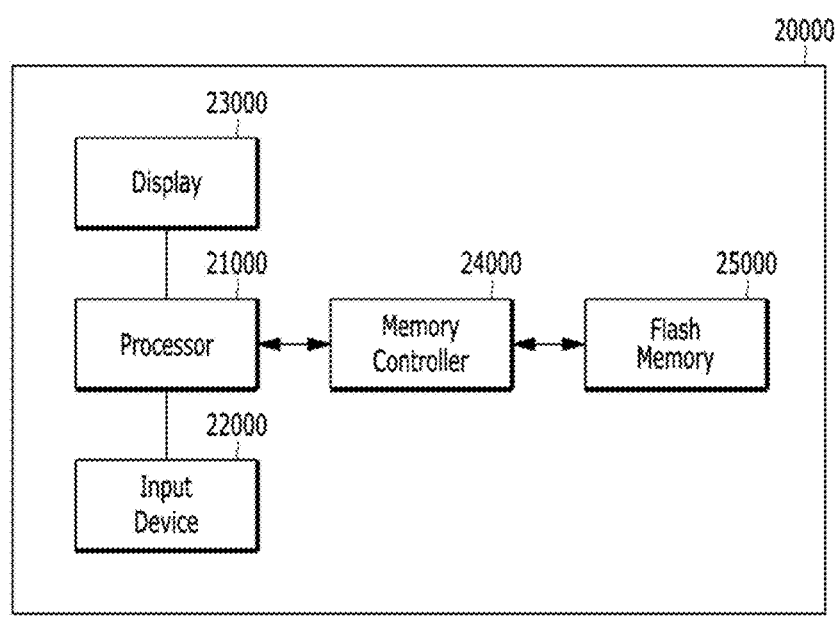
FIG. 16 is a block diagram schematically illustrating an electronic device including a semiconductor memory system in accordance with an embodiment of the present invention.

FIG. 16 is a block diagram schematically Illustrating an electronic device 20000 including a memory controller 24000 and a flash memory device 25000 in accordance with an embodiment of the present invention.

Referring to FIG. 16, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the flash memory device 25000 such as, the flash memory device 200, and the memory controller 24000 to control an operation of the flash memory device 25000.

The electronic device 20000 may include a processor 21000 to control an overall operation of the electronic device 20000. The memory controller 24000 may be controlled by the processor 21000.

The processor 21000 may display data stored in the semiconductor memory system through a display 23000 according to an input signal from an input device 22000. For example, the input device 22000 may be implemented by a pointing device such as a touch pad, a computer mouse, a key pad, or a keyboard.

Figure 17:
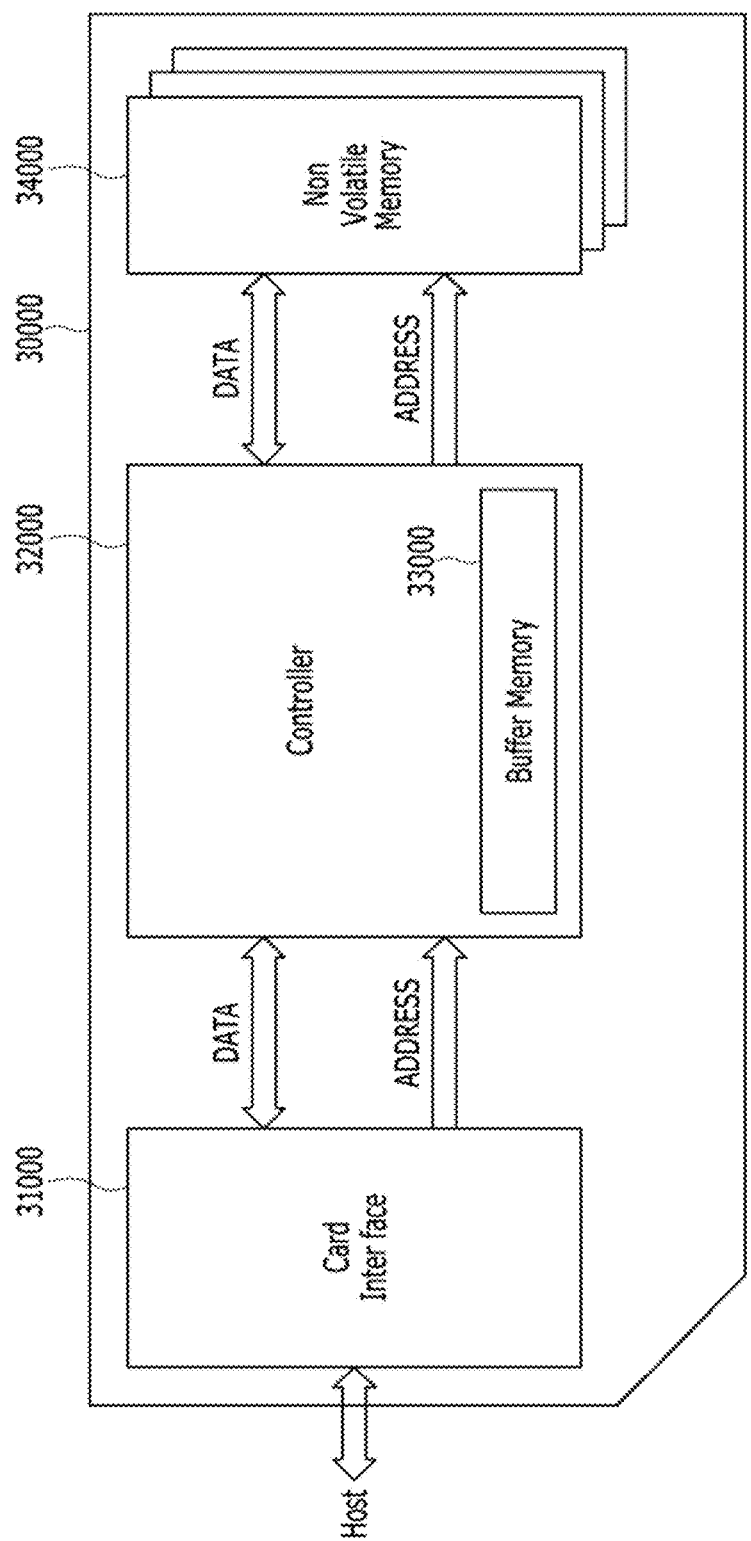
FIG. 17 is a block diagram schematically illustrating an electronic device including a semiconductor memory system in accordance with an embodiment of the present invention.

FIG. 17 is a block diagram schematically illustrating an electronic device 30000 including a semiconductor memory system 34000 in accordance with an embodiment of the present invention.

Referring to FIG. 17, the electronic device 30000 may include a card interface 31000, the memory controller 32000, and the semiconductor memory system 34000, for example the flash memory device 200.

The electronic device 30000 may exchange data with a host through the card interface 31000. The card interface 31000 may be a secure digital (SD) card interface or a multi-media card (MMC) Interface, which will not limit the scope of the present invention. The card interface 31000 may interface the host HOST and the memory controller 32000 according to the communications protocol of the host HOST capable of communicating with the electronic device 30000.

The memory controller 32000 may control an overall operation of the electronic device 30000, and may control data exchange between the card interface 31000 and the semiconductor memory system 34000. A buffer memory 33000 of the memory controller 32000 may buffer data transferred between the card interface 31000 and the semiconductor memory system 34000.

The memory controller 32000 may be coupled with the card interface 31000 and the semiconductor memory system 34000 through a data bus DATA and an address bus ADDRESS. In accordance with an embodiment, the memory controller 32000 may receive an address of data, which is to be read or written, from the card interface 31000 through the address bus ADDRESS, and may send it to the semiconductor memory system 34000.

Also, the memory controller 32000 may receive or transfer data to be read or written through the data bus DATA connected with the card interface 31000 or the semiconductor memory system 34000.

When the electronic device 30000 is connected with the host HOST such as a PC, a tablet PC, a digital camera, a digital audio player, a mobile phone, console video game hardware or a digital set-top box, the host HOST may exchange data of the semiconductor memory system 34000 through the card interface 31000 and the memory controller 32000.

What is claimed is:

1. A read method of a semiconductor memory system including a nonvolatile memory device and a memory controller, the read method comprising:
    a first step of performing a first ECC decoding to first data stored in the nonvolatile memory device, wherein the first data is read using a first read voltage;
    a second step of generating second data by re-reading the first data using a second read voltage when the first ECC decoding fails;
    a third step of generating third data by performing a second ECC decoding to the second data;
    a fourth step of obtaining an error-bit-number, which is a number of bits different between the second data and the third data, when the second ECC decoding fails;
    a fifth step of repeating the second to fourth steps by changing the second read voltage until the error-bit-number is smaller than a predetermined threshold value; and
    a sixth step of
    performing a third ECC decoding to an optimal data.

2. The read method of the semiconductor memory system of claim 1, wherein the fourth step performs an exclusive OR operation to the second data and the third data to obtain the number of error bits.

3. The read method of the semiconductor memory system of claim 1, wherein the fifth step repeats the second to fourth steps by changing the second read voltage by a fixed amount of voltage variation.

4. The read method of the semiconductor memory system of claim 1, wherein the second ECC decoding is a hard decoding.

5. The read method of the semiconductor memory system of claim 1, wherein the third ECC decoding is a soft decoding.

6. A read method of a semiconductor memory system including a nonvolatile memory device and a memory controller, the read method comprising:
- a first step of performing a first ECC decoding to first data stored in the nonvolatile memory device, wherein the first data is read using a first read voltage;
- a second step of generating second data by re-reading the first data using a second read voltage when the first ECC decoding fails;
- a third step of generating third data by performing a second ECC decoding to the second data;
- a fourth step of obtaining an error-bit-number, which is a number of bits different between the second data and the third data, when the second ECC decoding fails;
- a fifth step of obtaining N sets of error-bit-numbers by repeating N times the second to fourth steps by changing the second read voltage; and
- a sixth step of
- performing a third ECC decoding to an optimal data that is the second data read using the second read voltage; with which the error-bit-number is a minimum among the N sets of error-bit-numbers.

7. The read method of the semiconductor memory system of claim 6, wherein the fourth step obtains the error-bit-number through an exclusive OR operation to the second data and the third data.

8. The read method of the semiconductor memory system of claim 6, wherein the fifth step repeats the second to fourth steps by changing the second read voltage by a fixed amount of voltage variation.

9. The read method of the semiconductor memory system of claim 6, wherein the second ECC decoding is a hard decoding.

10. The read method of the semiconductor memory system of claim 6, wherein the third ECC decoding is a soft decoding.

11. A read method of a semiconductor memory system including a nonvolatile memory device and a memory controller, the read method comprising:
- a first step of performing a first ECC decoding to first data stored in the nonvolatile memory device, wherein the first data is read using a first read voltage;
- a second step of generating second data by re-reading the first data using a second read voltage when the first ECC decoding fails;
- a third step of generating third data by performing a second ECC decoding to the second data;
- a fourth step of obtaining an error-bit-number, which is a number of bits different between the second data and the third data, when the second ECC decoding fails;
- a fifth step of obtaining N sets of error-bit-numbers by repeating N times the second to fourth steps by changing the second read voltage until the error-bit-number is smaller than a predetermined threshold value; and
- a sixth step of
- performing a third ECC decoding to a first optimal data that is the second data read using the second read voltage, with which the error-bit-number is smaller than the predetermined threshold value before the repetition of the second to fourth steps reaches the N times.

12. The read method of the semiconductor memory system of claim 11, wherein the third step obtains the error-bit-number through an exclusive OR operation to the second data and the third data.

13. The read method of the semiconductor memory system of claim 11, wherein the fifth step repeats the second to fourth steps by changing the read voltage by a fixed amount of voltage variation.

14. The read method of the semiconductor memory system of claim 11, further comprising the seventh step of performing the third ECC decoding to a second optimal data that is the second data read using the second read voltage, with which the error-bit-number is minimum among the N sets of error-bit-numbers, when any of the N sets of error-bit-numbers is not smaller than the predetermined threshold value after the repetition of the second to fourth steps reaches the N times.

15. The read method of the semiconductor memory system of claim 11, wherein the second ECC decoding is a hard decoding.

16. The read method of the semiconductor memory system of claim 11, wherein the third ECC decoding is a soft decoding.

* * * * *